US008225854B2

(12) United States Patent
Ippoushi et al.

(10) Patent No.: US 8,225,854 B2
(45) Date of Patent: Jul. 24, 2012

(54) HEAT SINK AND COOLING UNIT USING THE SAME

(75) Inventors: Shigetoshi Ippoushi, Tokyo (JP); Akira Yamada, Tokyo (JP); Takeshi Tanaka, Tokyo (JP); Akihiro Murahashi, Tokyo (JP); Kazuyoshi Toya, Tokyo (JP); Hideo Okayama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 963 days.

(21) Appl. No.: 11/718,272

(22) PCT Filed: Jan. 11, 2006

(86) PCT No.: PCT/JP2006/300208
§ 371 (c)(1),
(2), (4) Date: Apr. 30, 2007

(87) PCT Pub. No.: WO2006/075614
PCT Pub. Date: Jul. 20, 2006

(65) Prior Publication Data
US 2009/0080159 A1    Mar. 26, 2009

(30) Foreign Application Priority Data

Jan. 14, 2005  (JP) .................................. 2005-007975

(51) Int. Cl.
*F28D 7/06* (2006.01)
*F28F 7/00* (2006.01)
(52) U.S. Cl. ...................................... 165/176; 165/80.4
(58) Field of Classification Search ................. 165/80.2, 165/80.4, 104.31, 104.33, 173, 176; 361/699; 257/714
See application file for complete search history.

(56) References Cited

U.S. PATENT DOCUMENTS

| | | | | |
|---|---|---|---|---|
| 2,880,577 A | * | 4/1959 | Snell et al. ....................... 60/260 |
| 2,942,165 A | * | 6/1960 | Jackson et al. ................. 257/714 |
| 3,327,776 A | * | 6/1967 | Butt .............................. 165/80.4 |
| 3,921,201 A | | 11/1975 | Eisele et al. |
| 4,494,171 A | | 1/1985 | Bland et al. |
| 5,270,572 A | | 12/1993 | Nakajima et al. |
| 5,370,178 A | * | 12/1994 | Agonafer et al. ............. 165/137 |
| 5,465,192 A | * | 11/1995 | Yoshikawa ..................... 361/705 |
| 5,645,127 A | * | 7/1997 | Enderle et al. ................ 165/176 |
| 5,761,808 A | * | 6/1998 | Patel et al. ................ 29/890.052 |
| 6,230,791 B1 | * | 5/2001 | Van Dine et al. ............. 165/80.4 |
| 6,305,463 B1 | * | 10/2001 | Salmonson .................. 165/80.3 |
| 2002/0043716 A1 | | 4/2002 | Miller et al. |
| 2003/0090873 A1 | * | 5/2003 | Ohkouchi ...................... 361/704 |
| 2003/0133257 A1 | | 7/2003 | Beihoff et al. |
| 2004/0061138 A1 | | 4/2004 | Shinohara et al. |

(Continued)

FOREIGN PATENT DOCUMENTS

DE         102 03 239 A1    6/2003

(Continued)

*Primary Examiner* — Tho V Duong
(74) *Attorney, Agent, or Firm* — Leydig, Voit & Mayer, Ltd.

(57) ABSTRACT

A heat sink including a compact cooling system, superior uniformity of heating, provides a compact cooling unit superior in uniformity of cooling. A heat sink includes a header for distribution connected to a cooling fluid inlet, a header for confluence connected to a cooling fluid outlet and parallel to and adjacent to the header for distribution and a heat transfer vessel including a heating element mounting surface as well as channels inside. The channels are connected to the header for distribution and the header for confluence.

3 Claims, 14 Drawing Sheets

U.S. PATENT DOCUMENTS

2006/0254752 A1* 11/2006 Narakino et al. ............ 165/80.4
2006/0262502 A1* 11/2006 Chang et al. ................. 361/699

FOREIGN PATENT DOCUMENTS

| | | |
|---|---|---|
| EP | 1 047 294 A1 | 10/2000 |
| JP | 59-193053 | 11/1984 |
| JP | 5-3274 | 1/1993 |
| JP | 8-172285 | 7/1996 |
| JP | 10-51169 | 2/1998 |
| JP | 10-303586 | 11/1998 |
| JP | 2002-170915 | 6/2002 |
| JP | 2004-296748 | 10/2004 |

* cited by examiner

HEAT SINK AND COOLING UNIT USING THE SAME

TECHNICAL FIELD

The present invention relates to a heat sink for cooling a heating element formed from electronic components or the like, particularly, a heat sink having a structure in which forced convection is used for cooling. The invention also relates to a cooling unit to which the above heat sink is connected.

BACKGROUND ART

JP-A-2002-170915 (referred to as a prior art, hereinafter) discloses the above kind of conventional heat sink. The conventional heat sink comprises a heat transfer vessel provided inside with a channel and a heat transfer accelerator (such as a fin or a turbulent flow accelerator) in the channel. In the heat transfer vessel, formed are an entrance side space for a cooling fluid and an exit side space for the cooling fluid. Making the cooling fluid flow from the entrance side space to the exit side space causes a base plate to be cooled, and thereby, electronic components mounted to the base plate to be cooled. The entrance side space for the cooling fluid and the exit side space for the cooling fluid are provided separately on the ends of the both sides of the heat transfer vessel as shown in FIG. 3 of the prior art or formed on the same end on one side of the heat transfer vessel so as to be separated from each other as shown in FIG. 2 of the prior art.

Patent Reference 1: JP-A2002-170915

DISCLOSURE OF THE INVENTION

Problems that the Invention is to Solve

In the conventional heat sink in which the entrance side space for the cooling fluid and the exit side space for the cooling fluid are separately provided on the both sides of the heat transfer vessel, a cooling fluid inlet in the entrance side space for the cooling fluid and a cooling fluid outlet in the exit side space for the cooling fluid are provided so as to be largely separated in location. This requires spaces for laying pipes to the cooling fluid inlet and the cooling fluid outlet, respectively, and further requires spaces for detaching pipes in maintenance. This causes a problem that the volume of a whole cooling system to be increased.

Moreover, in the above case, some cooling systems are difficult to share components since the length of the pipes is not same when a heat sink and pump or a fan are connected in series in laying the pipes to form a cooling system. In addition, long pipes due to the above cause increase in pressure loss occurring in the cooling system. This causes a problem that the flow rate in circulation of the cooing fluid and a heat characteristic are deteriorated.

It may be possible to provide a header for distribution in the entrance side space for the cooling fluid and a header for confluence in the exit side space for the cooling fluid. The header for distribution and the header for confluence, however, play a roll to control deviation in flow in the channel of the heat transfer vessel and the cross-sections in flow in the respective headers are usually larger in area than the cross-section of the channel of the heat transfer vessel. Accordingly, the headers are respectively formed on the both ends of the heat transfer vessel in the case of a heat sink in which the headers are formed on the both ends of the heat transfer vessel, so that problems are caused such that an access surface is small in the vicinity of the heating element mounted on the heat transfer vessel and that an unnecessary space exists in the back of a part for mounting the heating element.

Furthermore, in the case of separately providing the entrance side part and the exit side part for the cooling fluid on one side of the heat transfer vessel, the channel in the heat transfer vessel is a long series channel. Accordingly, the cooling fluid receives heat from the heating element in passing through the channel in the heat transfer vessel to rise in temperature, so that the cooling fluid at an outflow part is higher in temperature than the cooling fluid at an inflow part. This causes a problem that a difference in temperature is increased in a surface for mounting the heating element. In the case of forming number of channels in the heat transfer vessel to form a parallel channel for the purpose of solving the above problem, there is also a problem that the volume of the heat sink is increased since the respective channels are crossed each other or a multiple U-turn part is formed.

The invention is to solve the above-mentioned problems. An object of the invention is to provide a heat sink volume of making a cooling system more compact. Another object of the invention is to provide a heat sink superior in uniformity of heat. Further another object of the invention is to provide a cooling unit, which is compact and superior in uniformity of heat.

Means for Solving the Problems

A heat sink according to the invention is a heat sink comprising: a header for distribution connected to a cooling fluid inlet; a header for confluence connected to a cooling fluid outlet and provided in parallel and adjacently to the header for distribution; and a heat transfer vessel including a heating element mounting surface as well as at least one or more channel inside, the channel connected to the header for distribution and the header for confluence.

Moreover, a cooling unit according to the invention is a cooling unit comprising: several heat sinks respectively including a header for distribution, a header for confluence provided in parallel and adjacently to the header for distribution and a heat transfer vessel including a heating element mounting surface as well as at least one or more channel inside, the channel connected to the header for distribution and the header for confluence; a connecting opening for connecting the respective headers for distribution of the heat sinks; a connecting opening for connecting the respective headers for confluence of the heat sinks; a cooling fluid inlet connected to the header for distribution of any of the heat sinks; and a cooling fluid outlet connected to the header for confluence of any of the heat sinks, the cooling unit wherein the channels in the respective heat transfer vessels of the heat sinks communicate with each other.

Effect of the Invention

In the heat sink according to the invention, a header for distribution is provided adjacently and in parallel to a header for confluence. This allows the cooling system to be made more compact and a heat sink superior in uniformity of heat to be provided.

Further, piling in layers plural heat sinks in which a header for distribution and a header for confluence are provided in parallel and adjacently to each other allows a cooling unit, which is compact and superior in uniformity of heat, to be provided.

BEST MODE FOR CARRYING OUT THE INVENTION

Embodiment 1

Figure 1:
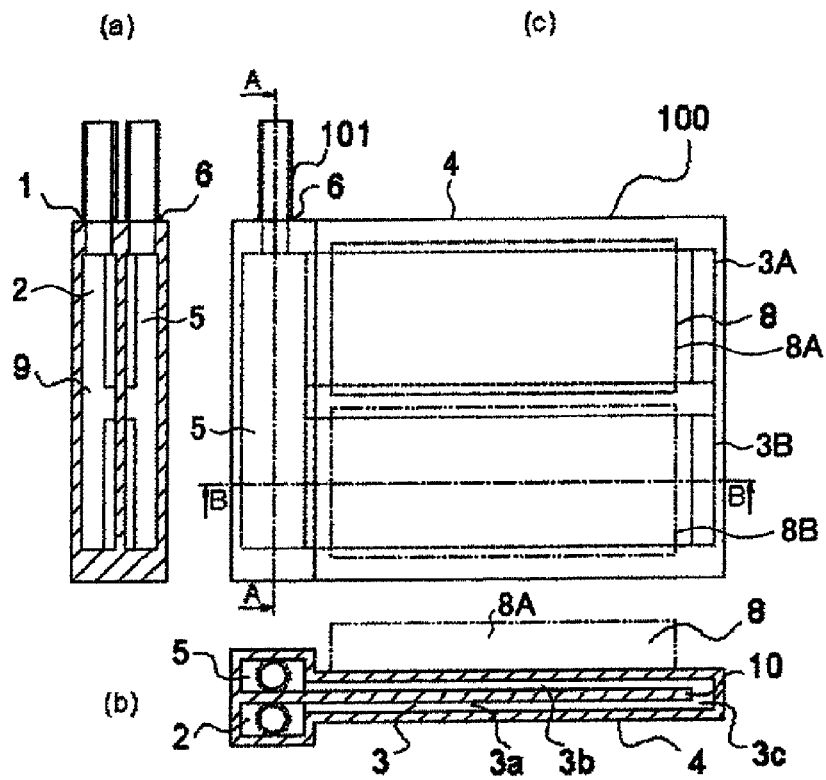
FIG. 1 shows a structure of a heat sink in accordance with Embodiment 1 of the invention.
Figure 2:
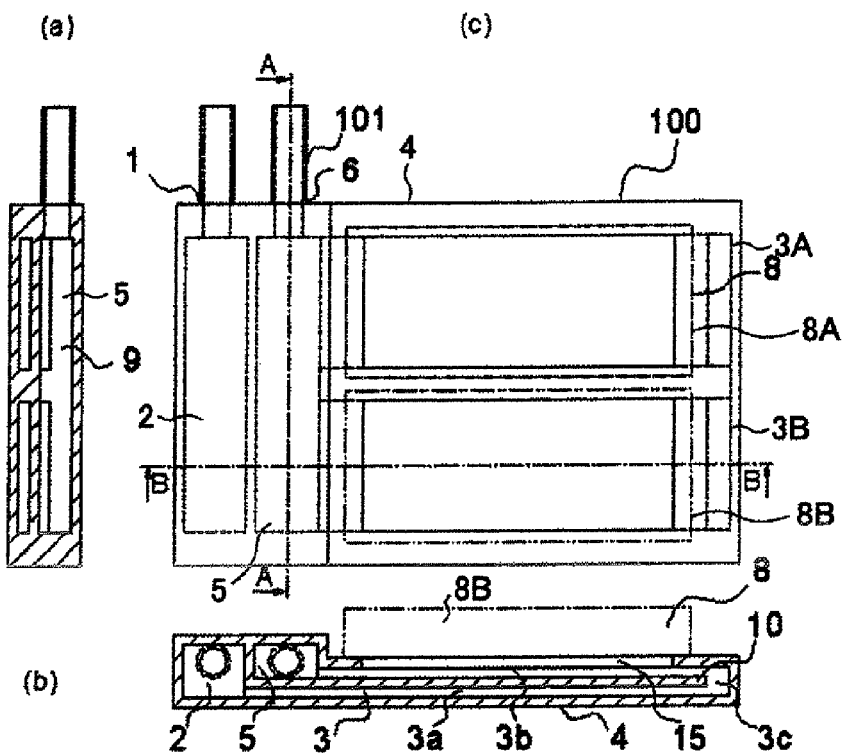
FIG. 2 shows a structure of another heat sink in accordance with Embodiment 1 of the invention.

FIG. 1 shows a simplified structure of a heat sink in accordance with Embodiment 1 of the invention. FIG. 1(c) is a top view of the heat sink. FIG. 1(a) is a sectional view taken along a line A-A in FIG. 1(c). FIG. 1(b) is a sectional view taken along a line B-B in FIG. 1(c). FIG. 2 illustrates another structure of the heat sink in accordance with Embodiment 1 of the invention. FIG. 2(c) is a top view of the heat sink. FIG. 2(a) is a sectional view taken along a line A-A in FIG. 2(c). FIG. 2(b) is a sectional view taken along a line B-B in FIG. 2(c).

In FIGS. 1 and 2, a heat sink 100 forms a cooling system for cooling a heating element 8 mounted thereto. The heat sink 100 comprises: a cooling fluid inlet 1 through which a cooling fluid 9 of low temperature enters; a header for distribution 2 for dividing the entered cooling fluid 9; a heat transfer vessel 4 thermally connected to the heating element 8, which is provided on a heating element mounting surface, and provided inside with a channel 3; a header for confluence 5 into which the cooling fluid 9 of high temperature due to absorption of heat from the heating element 8 flows; and a cooling fluid outlet 6 from which the confluent cooling fluid 9 is discharged. The heat sink 100 thus forms a series of flowing channels. The header for distribution 2 and the header for confluence 5 in Embodiment 1 are provided in parallel and adjacent to one side end, concretely, a left side end of the heat sink 100. The header for distribution 2 and the header for confluence 5 are provided in parallel vertically in a thickness direction of the heat transfer vessel 4 and are piled adjacently to each other in the thickness direction of the heat transfer vessel 4 in a structure in FIG. 1. They are provided in parallel adjacently on the same side of a heat transfer surface of the heat transfer vessel 4, that is, a heating element mounting surface so as to be adjacent to each other in a direction crossing at right angles with the thickness direction of the heat transfer vessel 4 in a structure in FIG. 2. In the structure in FIG. 2, the heat sink 100 is thinner in thickness, and thereby, more compact than the heat sink 100 having the structure in FIG. 1. The channel 3 comprises two channels 3A and 3B provided in parallel to each other. Each of the channels 3A and 3B is arranged to have a going channel 3a and a returning channel 3b, which are connected by means of a U-turn channel 3c. The going channel 3a and the returning channel 3b are piled vertically through a middle plate 10, which forms a partition, to form a double-layered structure. The header for distribution 2 is connected with the going channels 3a of the respective channels 3A and 3B while the header for confluence 5 is connected to the returning channels 3b of the respective channels 3A and 3B. The cooling fluid inlet 1 is provided on an end of the header for distribution 2. The cooling fluid outlet 6 is provided on an end of the header for confluence 5. The heating element 8, which is a subject to cooling, is mounted in contact with the heat transfer vessel 4 to be thermally connected thereto.

Connecting a pump or a fan to the heat sink 100 having such a structure through a pipe 101 allows a cooling system in which the cooling fluid 9 flows in the heat sink 100 to waste heat generated from the heating element 8 around the heating element 8, namely, an open type cooling system to be formed.

Moreover, using the pipe 101 to connect the heat sink 100 with a radiator to further form a distribution loop for circulation allows a circulation type cooling system to be formed. A reservoir and a filter may be provided in a halfway point of the distribution loop. In this case, the cooling fluid 9 circulates in the distribution loop to carry the heat generated from the heating element 8 to the radiator from which the heat is wasted outside.

Moreover, plural heat sinks 100 having a structure shown in Embodiment 1 may be connected in series or in parallel through the pipe 101 to form a series type cooling unit or a parallel type cooling unit.

In Embodiment 1, the channel 3 comprises two channels 3A and 3B as shown in FIGS. 1(c) and 2(c), the channels 3A and 3B respectively including the going channel 3a, the U-turn channel 3c and the returning channel 3b and being connected to the header for distribution 2 and the header for confluence 5 in parallel to each other. The invention, however, is not limited to the above. The channel 3 may be a single channel or formed from three or more channels connected in parallel.

Furthermore, a flowing direction of the cooling fluid is not specifically limited. A relation in location or functions may be exchangeable between the cooling fluid inlet 1 and the cooling fluid outlet 6, the header for distribution 2 and the header for confluence 5 or the going channel 3a and the returning channel 3b of the channel 3.

In addition, as shown in FIGS. 1(c) and 2(c), the heating element 8 also includes two heating elements 8A and 8B, which are mounted to the heat transfer vessel 4 at places corresponding to the channels 3A and 3B respectively to be cooled by means of the cooling fluid flowing in the respective channels 3A and 3B. The invention, however, is not limited to the above. It may be arranged that one heating element 8 be provided correspondingly to two or more channels 3 to be cooled by means of the cooling fluid flowing in the respective channels.

Moreover, the heat sink 100 in Embodiment 1 is formed from the heat transfer vessel 4, the header for distribution 2 and the header for confluence 5, which are formed into one body. It may be possible, however, that the header for distribution 2, the header for confluence 5 and the heat transfer vessel 4 are assembled into one body after they are formed individually. The heat transfer vessel 4 may be divided into an upper plate, a middle plate and a bottom plate in forming. The heat transfer vessel 4 may be also formed into a structure of piled layers formed from a cladding material. A method of manufacturing the heat sink, a method of manufacturing respective divided elements and a method of assembling the respective elements, namely, a method of fixing and a method of sealing are not specifically limited.

An operation of the heat sink 100 in Embodiment 1 will be described now. In FIG. 1, the cooling fluid 9 entered from the cooling fluid inlet 1 to the header for distribution 2, a cooling medium, for example, is divided into the two channels 3A and 3B in the heat transfer vessel 4. The cooling fluid 9 having flowed into the heat transfer vessel 4 passes through the going channels 3a (lower channels) in the respective channels 3A and 3B, makes a U-turn through the U-turn channel 3c provided at the right end of the heat sink 100, passes through the returning channels 3b (upper channels), flows into the header for confluence 5 to be confluent and flows to the cooling fluid outlet 6. At that time, a wall of the returning channel 3b of the heat transfer vessel 4 directly contacting with the heating elements 8A and 8B, namely, a side wall on which the heating elements 8A and 8B are provided receives heat to rise in temperature. This causes a difference in temperature between the cooling fluid 9 in the returning channel 3b and the wall of the returning channel 3b, so that heat is transferred from the wall of the returning channel 3b to the cooling fluid 9. As a result, the cooling fluid 9 rises in temperature to be discharged from the cooling fluid outlet 6. On the other hand, the cooling fluid 9 in the returning channel 3b becomes higher in temperature than the cooling fluid 9 in the going channel 3a (in the lower channel) due to a rise in temperature of the cooling fluid 9 in the returning channel 3b. This causes the heat to be transferred from the cooling fluid 9 in the returning channel 3b to the cooling fluid 9 in the going channel 3a through the middle plate 10, which is a partition between the going channel 3a and the returning channel 3b. As a result, the cooling fluid 9 in the going channel 3a receives heat to rise in temperature while the cooling fluid 9 in the returning channel 3b is cooled. This causes a rise in temperature of the cooling fluid 9 in the returning channel 3b to be decreased, and thereby, deviation in temperature in mounting surfaces of the heating elements 8A and 8B to be reduced, so that uniformity of heat is improved. As described above, the cooling fluid 9 passes through the cooling fluid inlet 1, the header for distribution 2, the channels 3A and 3B in the heat transfer vessel 4, the header for confluence 5 and the cooling fluid outlet 6 in order, rises in temperature to a high degree in passing through the channels 3A and 3B and is continuously discharged with its temperature being high.

Generally, the cooling fluid in a downstream channel is higher in temperature than the cooling fluid in an upstream channel when the cooling fluid flowing in a channel receives heat from a channel wall of the heat transfer vessel especially on a side provided with the heating element to rise in temperature to a high degree. Accordingly, temperature of a heating element mounting surface located on a downstream side of the channel is higher than that of a heating element mounting surface located on an upstream side of the channel, so that deviation in temperature in a heating element mounting surface is large. This causes a problem that the deviation in temperature causes dispersion in electric characteristic, which disables a desired function to be achieved, in the case of using electronics as the heating element, for example. The deviation in temperature also causes deviation in electric resistance, so that a problem such as deviation in calorific value (local heating, hot spot) and thermal run-away occurs.

In Embodiment 1, however, a range of a change in temperature of the cooling fluid 9 inside the going channel 3a and the returning channel 3b is narrow since the channels 3A and 3B have a folded double-layered structure and heat exchange is carried out between the cooling fluid 9 flowing in the going channel 3a and the cooling fluid 9 flowing in the returning channel 3b through the middle plate 10. Accordingly, the deviation in temperature in a mounting surface of the heating element 8 is made small, and thereby, the uniformity of heat is improved, so that the above-mentioned problem can be prevented.

Further, in a conventional heat sink, a cooling fluid inlet and a cooling fluid outlet, which are separately provided, require large spaces for laying pipes in putting the heat sink in a cooling system, as described above. In the case of providing a connector for detachment in the middle of a pipe in order to carry out detachment in maintenance, spaces for carrying out the detachment should be respectively secured, so that the capacity of the cooling system becomes large. As a conventional heat sink, also used having been a heat sink having a continuous meandering channel. In this case, it is possible to provide a cooling fluid inlet and a cooling fluid outlet adjacently to each other. This causes a problem, however, that a loss in pressure becomes large in the case of a long channel due to a large size of heat sink, the flow rate in circulation of the cooling fluid is reduced, and thereby, a heat characteristic is deteriorated. There is also a problem that a rise in temperature of the cooling fluid causes large deviation in temperature in a heating element mounting surface, as described above. Moreover, in the case of increasing the width of a cooling part of the channel or providing the channels in parallel for the purpose of reducing the loss in pressure, the cooling fluid flow is easily biased in the channel and deviation in temperature in a heating element mounting surface is large. This is also a problem.

In Embodiment 1, however, the header for distribution 2 and the header for confluence 5, which are provided in parallel on one side of the heat sink 100, so that the cooling fluid inlet 1 and the cooling fluid outlet 6 can be provided closely. Accordingly, the spaces required for the cooling fluid inlet 1 and the cooling fluid outlet 6, respectively, can be shared, so that the cooling system can be made compact.

Furthermore, in Embodiment 1, providing the header for distribution 2 and the header for confluence 5 in parallel on one side of the heat sink 100 allows an access surface to the heating elements 8, 8A and 8B mounted to the heat sink 100 to be large, so that more flexible wiring is possible.

In addition, as shown in FIGS. 1(c) and 2(c), the cooling fluid inlet 1 and the cooling fluid outlet 6 can be provided closely at a corner of one side surface of the heat sink 100, so that wiring passing above the header for distribution 2 and the header for confluence 5 can be easily carried out.

In FIGS. 1 and 2, a direction almost vertical to extending lines of the going channels 3a and the returning channels 3b of the channels 3A and 3B is defined as a longitudinal direction of the header for distribution 2 and the header for confluence 5. The cooling fluid 9 is sent from the cooling fluid inlet 1 in the longitudinal direction of the header for distribution 2. The cooling fluid is discharged from the cooling fluid outlet 6 in the longitudinal direction of the header for confluence 5. Especially, the header for distribution 2 is connected in its longitudinal direction to the respective going channels 3a of the channels 3A and 3B. Accordingly, the cooling fluid sent in the longitudinal direction of the header for distribution 2 allows the going channels 3a of the respective channels 3A and 3B to be supplied with the almost equal cooling fluid. When the cooling fluid is sent from one place in a direction crossing at right angles with the longitudinal direction of the header for distribution 2, the cooling fluid concentrates in the going channel 3a closer to the place from which the cooling fluid is sent while the other going channel 3a can not be supplied with enough cooling fluid.

Further, the channel parts can be easily provided in parallel independently from each other in Embodiment 1, so that a loss in pressure can be reduced, and thereby, it can be made difficult to generate a one-sided drift in the channels.

In FIGS. 1 and 2, simply shown were the heating elements 8A and 8B in the shape of a block. The structure and size of the heating elements 8A and 8B, however, are not specifically limited so long as the heating elements are what applies heat to the heat sink 100, such as a heat generating source for a heater, electronics and an electronic component, a heat generating source formed by integrating the above, a heat radiating part of an apparatus for transferring heat from the above heat generating sources and a heat exchanger including a heat sink in accordance with the invention, for example.

The heating elements 8A and 8B are fixed to the heat transfer vessel 4 by soldering, brazing, or pressure welding or thermally connected through a contact heat resistance reducing agent (including a sheet) such as thermal grease.

The structure of the heating elements is not specifically limited as long as the heating elements 8A and 8B can be thermally connected with the cooling fluid 9.

The heating elements 8 may be provided in one heat sink 100 in single or plural number. Furthermore, the heating elements 8 may be provided on any of an upper surface, a lower surface and both surfaces of the heat sink 100.

In the case that the heating elements 8 are provided on the both surfaces of the heat sink 100, the heat sink may be fixed so that the heating elements 8 would hold the heat sink therebetween.

Figure 3:
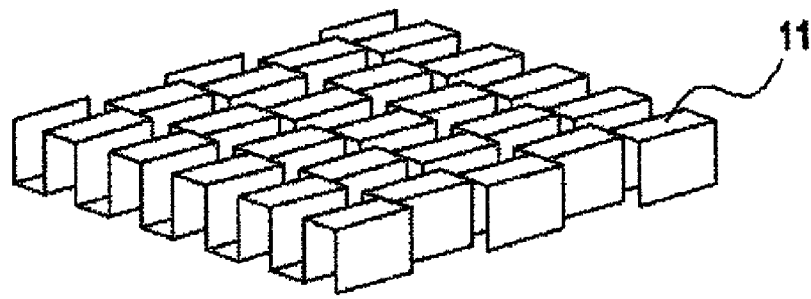
FIG. 3 is a perspective view showing a heat transfer accelerator in accordance with Embodiment 1 of the invention.
Figure 4:
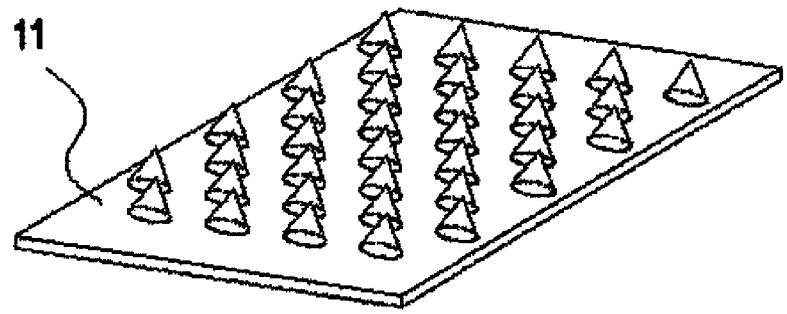
FIG. 4 is a perspective view showing another heat transfer accelerator in accordance with Embodiment 1 of the invention.

Inside the heat transfer vessel 4, formed are the channels 3A and 3B as described above. The channels 3A and 3B play a role of a container of the cooling fluid 9 and a passage through which the cooling fluid 9 flows. The channels 3A and 3B also play a role of thermally connecting the heating elements 8A and 8B with the cooling fluid 9 as well as diffusing and uniforming heat transferred from the heating elements 8A and 8B. Accordingly, heat transfer accelerators 11 may be provided in the channels 3A and 3B in order to accelerate heat transfer from the wall surfaces of the channels 3A and 3B to the cooling fluid 9. As the heat transfer accelerator 11, considered can be an insertion such as a fin having both of a heat transfer surface area enlarging effect and a heat transfer improving effect due to turbulent acceleration, for example, a projection substantially in the shape of a plate or a column, the projection provided on a channel wall, and a turbulent accelerator having the heat transfer improving effect due to turbulent acceleration, for example, various shapes of projection provided on a channel wall faced to the heating element mounting surface, a ribbon, a coil, an inner fin shown in FIG. 3, various shapes of projection shown in FIG. 4 and a substrate having plural openings, for example.

A heat transfer accelerator divided into plural numbers may be adjacently provided or plural heat transfer accelerators may be provided with any gap in providing the heat transfer accelerator 11 in the channel. Further, a rectification reinforcement may be provided in a gap between heat transfer accelerators chiefly for the purpose of reinforcement of the channels 3A and 3B.

The rectification reinforcement is for reinforcing upper and lower wall surfaces forming the channels 3A and 3B by means of a spring structure, a beam structure or the like. A structure of the rectification reinforcement is not specifically limited so long as flowing channels are secured while a change in form of the upper and lower wall surfaces of the channels 3A and 3B can be prevented. The rectification reinforcement also has a role of mixing and rectifying the cooling fluid 9 in some cases.

The middle plate 10 has a role of exchanging heat between the cooling fluid 9 in the going channel 3a and the cooling fluid 9 in the returning channel 3b. A heat transfer accelerator having a structure similar to that of the heat transfer accelerator 11 may be provided on a surface of the middle plate 10.

The U-turn channel 3c connecting the going channel 3a and the returning channel 3b may be in the shape of an elbow or a bend. A shape and a structure of the U-turn channel 3c is not specifically limited so long as the U-turn channel 3c can play a role of a passage connecting the going channel 3a and the returning channel 3b.

The heat transfer vessel 4 can be also used for fixing the heating element 8 and components accompanying thereto. Moreover, it may be possible to provide a fixing jig for a through hole or a screw hole for the attachment to peripheral apparatuses such as a cooling system, for example.

The heat sink 100 shown in FIG. 1 has a structure that the heating elements 8A and 8B are in contact with a wall of the heat transfer vessel 4, namely, an indirect cooling structure. The heat sink 100, however, may have a structure that the heating elements 8A and 8B are fitted in an opening 15 provided in the heat transfer vessel 4, namely, a direct cooling structure, as shown in FIG. 2. This causes lower surfaces of the heating elements 8A and 8B to be directly in contact with the cooling fluid 9, and thus, heat is directly transferred from the heating elements 8A and 8B to the cooling fluid 9. This allows the contact heat resistance generated between the heating elements 8A and 8B and the wall of the heat transfer vessel 4 in indirect cooling to be eliminated, and thereby, the heat characteristic to be improved. The opening 15 may also be provided in the heat sink 100 in single or plural number similarly to the heating element 8. The opening 15 may be provided on any of an upper surface, a lower surface and both surfaces Moreover, projections or convexes for positioning may be provided circularly or intermittently on the surface of the heat transfer vessel around the opening 15 in order to make positioning of the heating elements 8A and 8B easy.

The heat transfer vessel 4 and the heating elements 8A and 8B in the direct cooling structure may be fixed by means of a jig such as a bolt and a nut or a spring structure using a leaf spring and such. As a method of sealing the heat transfer vessel 4 and the heating elements 8A and 8B, considered may be welding or gluing. It is also possible to use a gasket or an O-ring to form a detachable structure. A sealing structure is not specifically limited so long as the cooling fluid 9 can be prevented from leaking and the heating elements 8A and 8B can be thermally connected to the cooling fluid 9 directly.

The header for distribution 2 plays a role of dividing the cooling fluid 9 sent from the cooling fluid inlet 1 and leading the same to the channels 3A and 3B. The header for distribution 2 further plays a role of preventing a one-sided drift in a single channel or a one-sided drift in plural parallel channels 3A and 3B. The header for confluence 5 plays a role of leading the cooling fluid 9 flowing from the channels 3A and 3B to the cooling fluid outlet 6. The header for confluence 5 further plays a role of preventing a one-sided drift in a single channel or a one-sided drift in plural parallel channels 3A and 3B, similarly to the header for distribution 2.

In the header for distribution 2 and the header for confluence 5, may be provided a rectifying structure for preventing a one-sided drift in the channels 3A and 3B such as a plate provided with plural holes, a plate provided with plural slits, a net-shaped plate, a projection provided on a header wall or a combination of the above plural components, for example. Especially, a curved projection (a guide blade) or a bending channel may be provided on a wall of the header for confluence 5 in order to change a flowing direction of the cooling fluid 9 flowing from the channels 3A and 3B into a direction to the downstream side of the header for confluence 5, that is, a direction substantially toward the cooling fluid outlet 6.

In the heat sink 100 shown in FIG. 1, the header for distribution 2 and the header for confluence 5, which are provided in parallel, are provided symmetrically with respect to the middle plate 10 and the respective headers 2 and 5 have a same cross-section. The cross sections of the respective headers 2 and 5 are not necessarily same. The oblateness of the above may be difference and any one of the cross sections may be larger. The shape of the cross section is not specifically limited. A circle, an ellipse and a rectangular may be considerable.

Furthermore, in the heat sink 100 in FIG. 2, the header for distribution 2 and the header for confluence 5, which are provided in parallel, are provided on a same surface side with respect to the middle plate 10. In this case, the cross sections of the respective headers may be in any shape. The height of an outer frame of a header part formed from the header for distribution 2 and the header for confluence 5, however, is preferably fixed as shown in FIG. 2. This allows a wiring plate or the like to be easily fitted to the heating elements 8A and 8B.

The cooling fluid inlet 1 plays a role of sending the cooling fluid 9 of a low temperature. On the other hand, the cooling fluid outlet 6 plays a role of discharging the cooling fluid 9 of a high temperature. The cooling fluid inlet 1 and the cooling fluid outlet 6 are connected to a pipe 101 such as a circular pipe, a rectangular pipe, a flexible tube or a hose, for example. The cooling fluid inlet 1 and the cooling fluid outlet 6 are preferably in a flat shape when the cross section of the header for distribution 2 or the header for confluence 5 is in a flat shape. The pipe 101 is also preferable to be a pipe smoothly flatted in the vicinity of a part connected with the cooling fluid inlet 1 and the cooling fluid outlet 6 so as to be connected to the same.

In FIGS. 1 and 2, shown are structures that the pipe 101 is fixed to the cooling fluid inlet 1 and the cooling fluid outlet 6 or that the cooling fluid inlet 1 and the cooling fluid outlet 6 are formed into one body with the pipe 101. The invention is not specifically limited to the structure. A structure that a pipe with a nipple is fixed or a structure that an O-ring or a gasket is used to connect the pipe 101 or the similar heat sink 100 may be considerable.

In addition, the cooling fluid inlet 1 and the cooling fluid outlet 6 are provided adjacently on an upper side surface on a left corner in FIGS. 1 and 2. The invention is not limited to the structure. Location for providing the cooling fluid inlet 1 and the cooling fluid outlet 6 may be selected on wall surfaces of the header for distribution 2 and the header for confluence 5, which are adjacently provided, properly in forming the cooling system.

A material for forming the heat sink 100 is preferable to be a material having high heat conductivity. The heat sink 100 can be preferably formed from a material superior in heat transfer characteristic, that is, metal such as aluminum and copper or a compound material including the above as a main material, for example. Especially, the mounting surfaces of the heating elements 8A and 8B of the heat transfer vessel 4, the walls of the channels 3A and 3B and the middle plate 10 are preferable to be formed from a material superior in heat transfer characteristic. On the other hand, a part other than the above may be molded with a resin material in view of easiness in molding and a low cost although the part may be also formed from a similar metal material described above. In the case that a part of the heat transfer vessel 4 is molded with a resin material, a metal plate such as a stainless plate, for example, may be provided on at least a part of the surface.

This allows deformation due to a change of the resin material according to the passage of time to be kept down. Particularly, fixing the heat transfer vessel 4 by holding the same between the heating elements 8A and 8B or jigs for fixing the heating elements 8A and 8B and the metal plate enables the effect to be enlarged.

A part of the metal plate may be bared in the channels 3A and 3B so that the metal plate would be in contact with the cooling fluid 9. This allows a withstand voltage test, which is carried out when the electronics or the like are provided as the heating elements 8A and 82, to be easily performed.

The metal plate has only to be provided on the heat transfer vessel 4. A size and a fitting method of the metal plate are not specifically limited. The metal plate may be fixed by means of a fixing jig such as a bolt or by vacuum evaporation, deposition and gluing. Further, the cooling fluid 9 should be arranged to be prevented from leaking from a bared part of the metal plate in the channels 3A and 3B when the part of the metal plate is bared. Accordingly, the metal plate may be closely fixed through an O-ring or a gasket.

The cooling fluid 9 is a liquid such as distilled water, antifreezing solution, oil, liquid carbon dioxide, alcohol and ammonia or a gas such as air and nitrogen gas.

Embodiment 2

Figure 5:
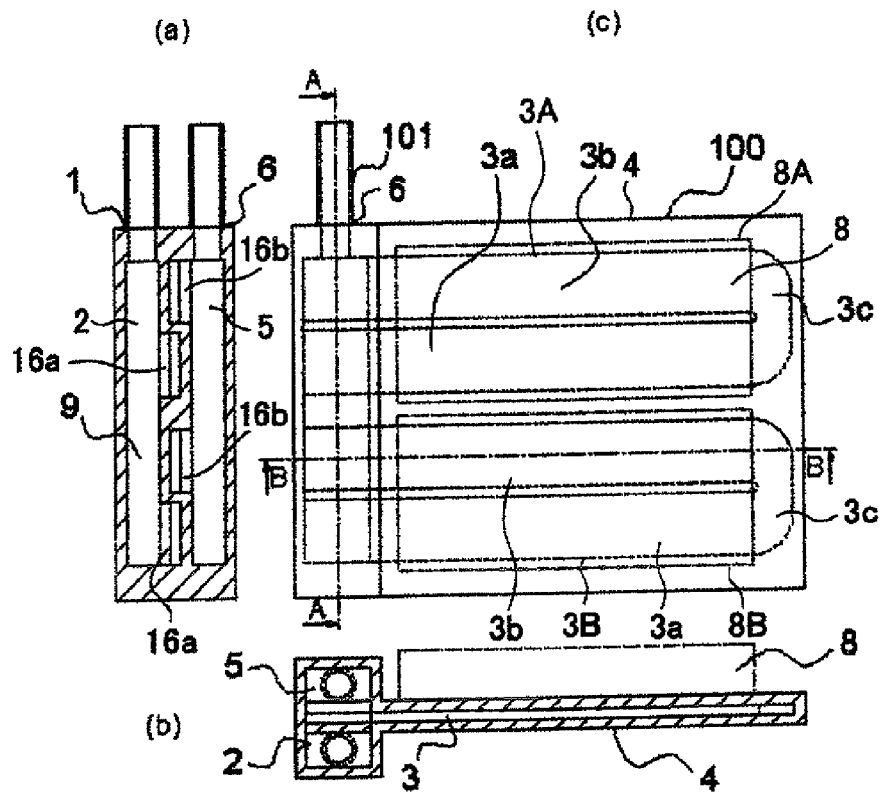
FIG. 5 shows a structure of a heat sink in accordance with Embodiment 2 of the invention.
Figure 6:
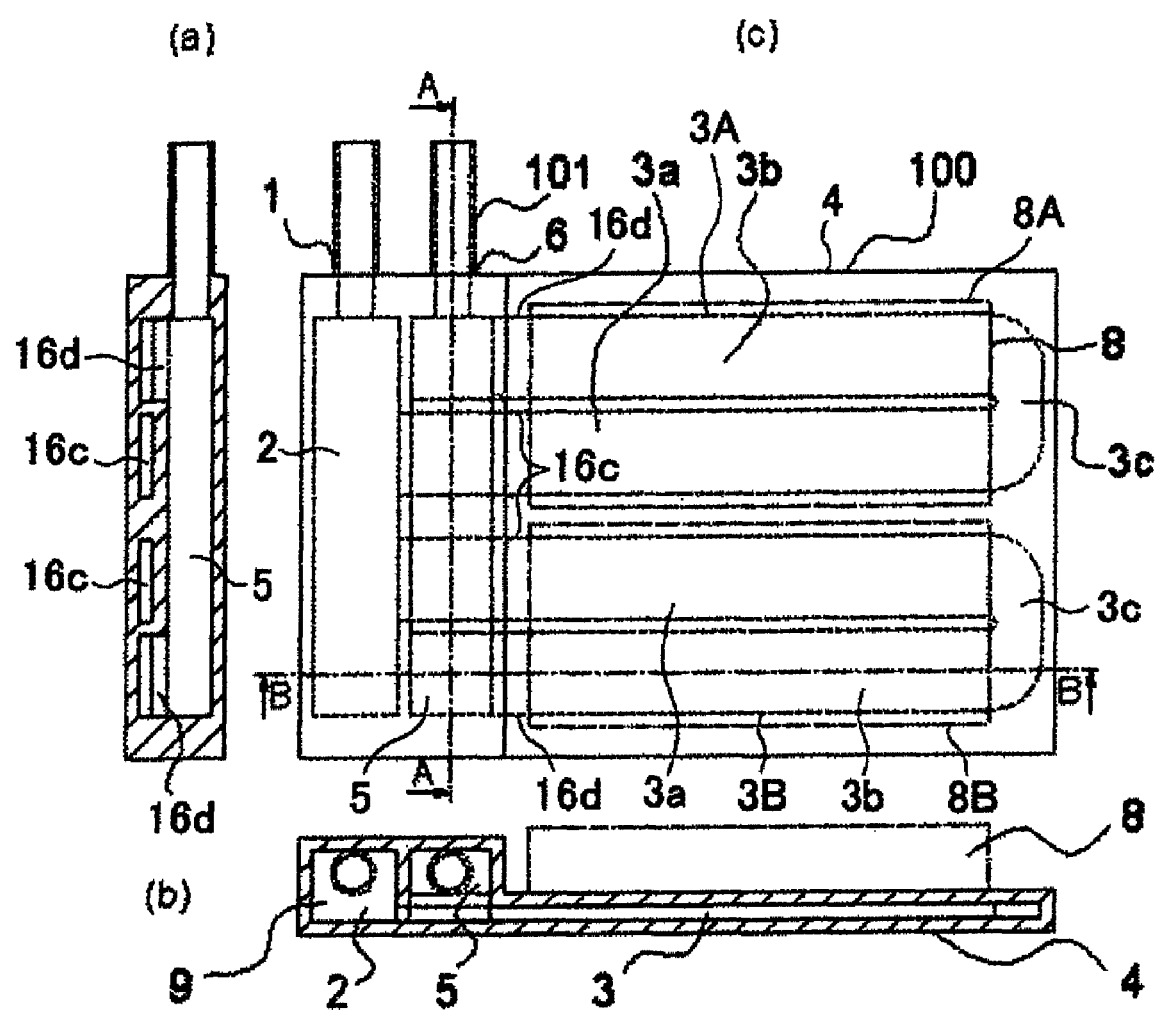
FIG. 6 shows a structure of another heat sink in accordance with Embodiment 2 of the invention.

FIG. 5 shows a simplified structure of a heat sink in accordance with Embodiment 2 of the invention. FIG. 5(c) is a top view of the heat sink. FIG. 5(a) is a sectional view taken along a line A-A in FIG. 5(c). FIG. 5(b) is a sectional view taken along a line B-B in FIG. 5(c). FIG. 6 shows another structure of the heat sink in accordance with Embodiment 2 of the invention. FIG. 6(c) is a top view of the heat sink. FIG. 6(a) is a sectional view taken along a line A-A in FIG. 6(c). FIG. 6(b) is a sectional view taken along a line B-B in FIG. 6(c).

In the heat sink 100 in accordance with Embodiment 2, the channel 3 formed in the heat transfer vessel 4 is formed from two channels 3A and 3B, as shown in FIGS. 5 and 6. The respective channels 3A and 3B are formed on one same plane to form a single-layered channel, namely, a single channel plane. That is to say, Embodiment 1 has a double-layered channel structure that the going channels 3a and the returning channels 3b of the respective channels 3A and 3B are formed in the thickness direction of the heat transfer vessel 4 and the respective channels 3A and BE are folded in the thickness direction. On the other hand, the respective channels 3A and 3B are formed on one same plane in the heat transfer vessel 4 in Embodiment 2. Each of the channels 3A and 3B is arranged to have the going channel 3a and the returning channel 3b on a same plane and turns in the U-turn channel 3c formed on the plane same as that of the going channel 3a and the returning channel 3b. Further, the header for distribution 2 and the header for confluence 5 are provided in parallel and adjacently to each other on the left side of the heat sink 100, similarly to Embodiment 1. In Embodiment 2, however, it is arranged that any one of the header for distribution 2 and the header for confluence 5 be offset with respect to a single channel plane on which the respective channels 3A and 3B are provided and the offset header 2 or 5 be connected to the respective channels 3A and 3B through connecting channels. The header for distribution 2 communicates with each of the going channels 3a of the respective channels 3A and 3B while the header for confluence 5 communicates with each of the returning channels 3b of the respective channels 3A and 3B.

In a structure in FIG. 5, the header for distribution 2 and the header for confluence 5 are provided vertically in the thickness direction of the heat transfer vessel 4 so as to hold therebetween the single channel plane on which the respective channels 3A and 3B are provided. Both of the header for distribution 2 and the header for confluence 5 are offset with a predetermined interval in the thickness direction of the heat transfer vessel 4 with respect to the single channel plane on which the respective channels 3A and 3B are provided. The header for distribution 2 is arranged to communicate with each of the going channels 3a of the respective channels 3A and 3B through a connecting channel 16a connected to a connecting opening provided in the header 2. The header for confluence 5 is arranged to communicate with each of the returning channels 3b of the respective channels 3A and 3B through a connecting channel 16b connected to a connecting opening provided in the header 5.

In a structure in FIG. 6, the header for distribution 2 and the header for confluence 5 are provided adjacently on a same side of a heat transfer surface of the heat transfer vessel 4. The header for distribution 2 of the two headers 2 and 5, the header for distribution 2 being provided on the outer side, is connected to each of the going channels 3a of the respective channels 3A and 3B formed on the single channel plane through a connecting channel 11c. The header for confluence 5 of the two headers 2 and 5, the header for confluence 5 being provided on the inner side, namely, on the heat transfer vessel 4 side, is offset with a predetermined interval in the thickness direction of the heat transfer vessel 4 with respect to the single channel plane on which the respective channels 3A and 3B are provided. The header for confluence 5 is arranged to communicate with each of the returning channels 3b of the respective channels 3A and 3B through a connecting channel 16d connected to a connecting opening provided in the header for confluence 5.

This allows the heat transfer vessel 4 to be made thin in thickness and more compact. Moreover, the two channels 3A and 3B can be provided in parallel in order without crossing although the channels 3A and 3B are formed in the single channel plane.

In FIG. 6, a direction substantially vertical to an extending line of the goring channels 3a and the returning channels 3b of the channels 3A and 3B is also defined as a longitudinal direction of the header for distribution 2 and the header for confluence 5. The cooling fluid 9 is sent from the cooling fluid inlet 1 in the longitudinal direction of the header for distribution 2. The cooling fluid is discharged from the cooling fluid outlet 6 in the longitudinal direction of the header for confluence 5. Especially, sending the cooling fluid in the longitudinal direction of the header for distribution 2 allows the going channels of the respective channels 3A and 3B to be supplied with substantially equal cooling fluid since the header for distribution 2 is connected to each of the going channels 3a of the channels 3A and 3R in the longitudinal direction of the header for distribution 2.

In Embodiment 2, the cooling fluid 9 in the returning channels 3b is higher in temperature than the cooling fluid 9 in the going channels 3a in the respective channels 3A and 3B. A series of the channels 3A and 3B comprising the going channels 3a, the U-turn channels 3c and the returning channels 3b, however, can be provided adjacently and in parallel in plural number, so that heat diffusion in the heat transfer vessel 4 or the heating elements 8A and BE of the heat transfer vessel 4 operates effectively. This allows the deviation in temperature in the mounting surface of the heating elements 8A and 8B to be made small and the uniformity of heat to be improved. The uniformity of heat is improved more when the more plural channels 3A, 3B, 3C . . . of small channel width are provided in parallel, particularly. The heating elements 8A and 8B are fixed to the heat transfer vessel 4 at places corresponding to the channels 3A and 3B, respectively.

The plural channels 3A and 3B are provided orderly so that the going channel 3a of the channel 3A would be adjacent to the returning channel 3b of the channel 3B in the structure in FIG. 5. It may be possible to arrange the respective going channels 3a of the adjacent channels 3A and 3B adjacently to each other so that the channels 3A and 3B would be provided symmetrically, as shown in FIG. 6. Further, in FIG. 6, the respective returning channels 3b of the adjacent channels 3A and 3B may be provided adjacently to each other so that the channels 3A and 3B would be provided symmetrically. An arrangement of the channels 3A and 3B is not limited as described above.

Moreover, the flowing direction of the cooling fluid is not specifically limited. A relation in location or functions may be exchangeable between the cooling fluid inlet 1 and the cooling fluid outlet 6, the header for distribution 2 and the header for confluence 5 or the going channels 3a and the returning channels 3b of the channels 3A and 3B.

In addition, the U-turn channel 3c connecting the going channel 3a and the returning channel 3b may be in the shape of an elbow or a bend. A shape of the U-turn channel 3c is not specifically limited.

It is, however, preferable to provide a guide blade such as a wing-shaped projection for controlling a one-sided drift and a separation flow, for example, in the U-turn channel 3c.

Figure 7:
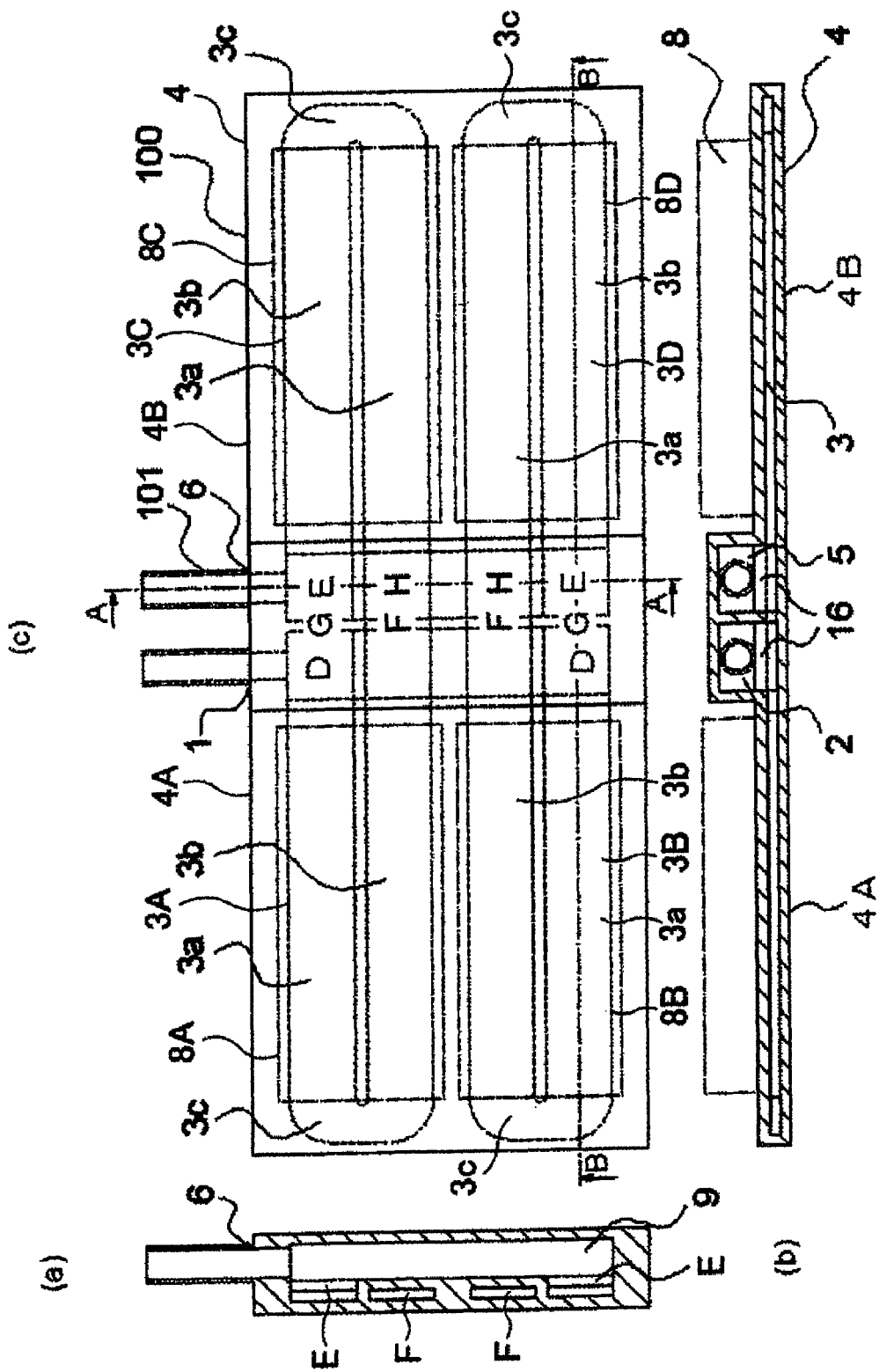
FIG. 7 shows a structure of further another heat sink in accordance with Embodiment 2 of the invention.

FIG. 7 shows further another structure of the heat sink in accordance with Embodiment 2. FIG. 7(c) is a top view of the heat sink. FIG. 7(a) is a sectional view taken along a line A-A in FIG. 7(c). FIG. 7(b) is a sectional view taken along a line B-B in FIG. 7(c).

In the heat sink 100 in FIGS. 5 and 6, the respective headers 2 and 5 are mounted on one side of the heat transfer vessel 4. The respective headers 2 and 5, however, are provided at the substantial center of the heat transfer vessel 4 in the heat sink 100 in FIG. 7. In a structure in FIG. 7, the header for distribution 2 and the header for confluence 5, which are provided in parallel, are located at the center and wing-shaped heat transfer vessels 4A and 4B are provided on the both sides of the header for distribution 2 and the header for confluence 5. Two channels 3A and 3B are formed in a single channel plane of the heat transfer vessel 4A. In the same single channel plane of the heat transfer vessel 4B, also formed are two channels 3C and 3D. Each of the channels 3A, 3B, 3C and 3D includes a going channel 3a, a U-turn channel 3c and a returning channel 3b.

Such a structure allows the heat transfer vessels 4A and 4B, namely, mounting surfaces of the heating elements 8A 8B, 8C and 8D to be provided on the both sides of the respective headers 2 and 5. Moreover, the above structure allows the heating elements 8A, 8B, 8C and 8D to be more freely arranged as well as allowing access to the heating elements 8A, 8B, 8C and 8D such as wiring to be made easier. The heating elements 8A, 8B, 8C and 8D are fixed to the heat transfer vessels 4A and 4B at places corresponding to the channels 3A, 3B, 3C and 3D, respectively, in the structure in FIG. 7.

In FIG. 7, a connecting opening D of the header for distribution 2 is provided at a place marked with "D" and a connecting opening E of the header for confluence 5 is provided at a place marked with "E" so that the connecting openings D and E would be adjacent to each other. The header for distribution 2 is provided with two connecting openings D, which communicate with the respective going channels 3a of the channels 3A and 3B. The header for confluence 5 is also provided with two connecting openings E, which communicate with the respective returning channels 3b of the channels 3C and 3D. The returning channel 3b of the channel 3A and the going channel 3a of the channel 3C communicate with each other via a connecting opening F. The channels 3A and 3C are connected in series between the connecting opening D of the header for distribution 2 and the connecting opening E of the header for confluence 5. The returning channel 3b of the channel 3B and the going channel 3a of the channel 3D also communicate with each other via a connecting opening F. The channels 3B and 3D are connected in series between the connecting opening D of the header for distribution 2 and the connecting opening E of the header for confluence 5. In this structure, the cooling fluid 9 flows from the header for distribution 2 into the channels 3A and 3B in the left heat transfer vessel 4A, passes through the upper part of the headers 2 and 5, and then, flows in the channels 3C and 3D in the right heat transfer vessel 4S into the header for confluence 5.

It may be possible in FIG. 7 that channel ends G of the channels 3A and 3C are connected to form a loop channel while channels ends G of the channels 3B and 3D are connected to form a loop channel, although it is omitted from the drawing.

In this case, the two connecting openings D of the header for distribution 2 are arranged to be provided at places marked with "D" while two connection openings H of the header for confluence 5 are arranged to be provided at places marked with "H". This allows the cooling fluid 9 flowing from the header for distribution 2 into the loop channel to be divided into right and left. One of the divided cooling fluids 9 passes through the channels 3A and 3B in the left heat transfer vessel 4A and flows above the headers 2 and 5 to be sent to the header of confluence 5. The other cooling fluid 9 flows above the header 2 and 5 and passes through the channels 3C and 3D in the right heat transfer vessel 4B to be sent to the header for confluence 5 again. Accordingly, the flowing length is shortened and a fluid characteristic is improved, so that the heat characteristic including the uniformity of heat improved.

In FIG. 7, shown is an example that the heat transfer vessel 4 is in the shape of a flat plate. The invention, however, is not limited to the above. The heat transfer vessel 4 may be substantially in the shape of V, U, a square or O (including a heat transfer vessel whose ends are connected to each other).

The similar shapes are considerable for the heat transfer vessel 4 also in FIGS. 1 to 6.

Embodiment 3

Figure 8:
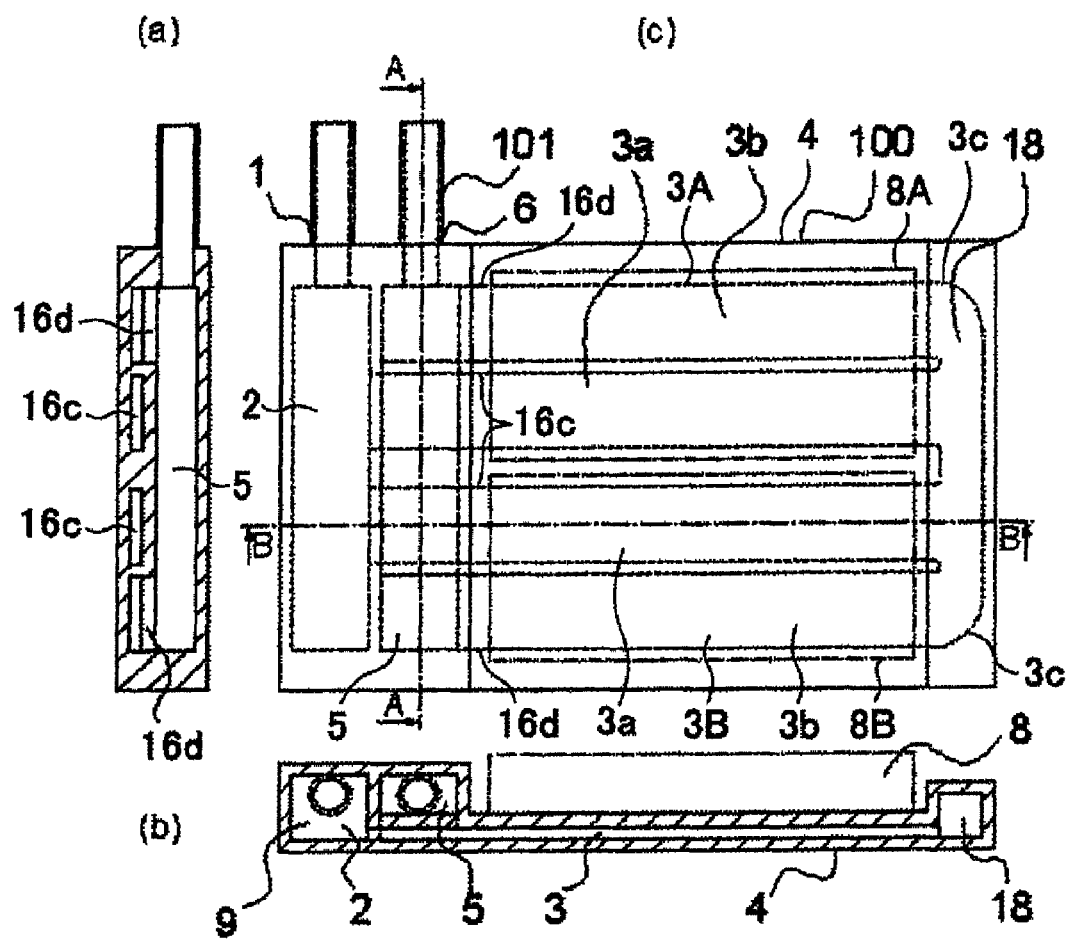
FIG. 8 shows a structure of a heat sink in accordance with Embodiment 3 of the invention.

FIG. 8 shows a simplified structure of a heat sink in accordance with Embodiment 3 of the invention. FIG. 8(c) is a top view of the heat sink. FIG. 8(a) is a sectional view taken along a line A-A in FIG. 8(c). FIG. 8(b) is a sectional view taken along a line B-B in FIG. 8(c).

The heat sink 100 in Embodiment 3 is arranged to have a mixing channel 18 through which the U-turn channels 3c in the middle part of the channels 3A and 3B communicate with each other. Ranges of a rise in temperature of the cooling fluid 9 in the respective channels 3A and 3B are different in the case that plural, two, for example, heating elements 8A and 8B are provided at places corresponding to the channels 3A and 3B and the respective heating elements 8A and 8B have different calorific values. Mixing the cooling fluid 9 flowing in the respective channels 3A and 3B in the middle of the channels 3A and 3B allows the temperature of the cooling fluid 9 to be made equal. That is to say, the maximum temperature of the cooling fluid 9 decreases. Sending the mixed cooling fluid 9 into the channels 3A and 3B again allows the uniformity of heat in the heat sink 100 to be improved, so that the heat characteristic is improved.

In the heat sink 100 in FIG. 8, shown is an example in which the U-turn channels 3c of the channels 3B and 3A in the heat sink 100 in FIG. 6 are connected via the mixing channel 18. The cooling fluid 9 having risen in temperature in the going channels 3a is arranged to be mixed in the mixing channel 18 to be sent to the returning channels 3b.

The header for distribution 2 in the heat sink 100 in FIG. 8 communicates with each of the going channels 3a of the respective channels 3A and 3B through the connecting channel 16c while the header for confluence 5 communicates with each of the returning channels 3b of the respective channels 3A and 3B through the connecting channel 16d.

It is preferable to provide in the mixing channel 18 a mixture accelerator, namely, an insertion such as a plate provided with plural holes, a plate provided with plural slits, a net, a twisted tape and a coil, a projection provided on the inner wall of the mixing channel 18 or combination of some of the above, for example. The mixture accelerator may have a structure same as that of the rectification reinforcement described in Embodiment 1.

Figure 9:
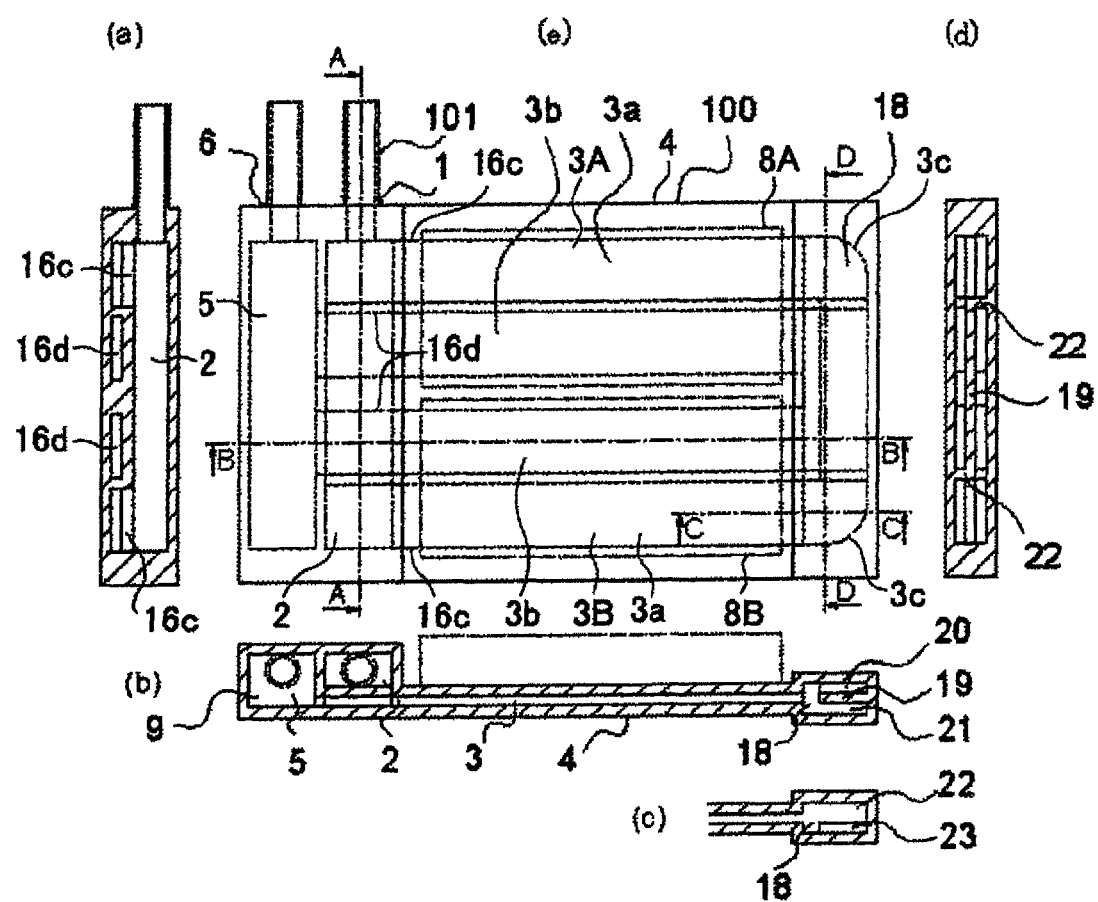
FIG. 9 shows a structure of another heat sink in accordance with Embodiment 3 of the invention.

FIG. 9 shows another structure of the heat sink in accordance with Embodiment 3 of the invention. FIG. 9(e) is a top view of the heat sink. FIG. 9(a) is a sectional view taken along a line A-A in FIG. 9(e). FIG. 9(b) is a sectional view taken along a line BOB in FIG. 9(e). FIG. 9(c) is a sectional view taken along a line C-C in FIG. 9(e). FIG. 9(d) is a sectional view taken along a line D-D in FIG. 9(e).

In the heat sink 100 shown in FIG. 9, the respective returning channels 3b of the two channels 3A and 3B are adjacent to each other at the center of the heat transfer vessel 4. A projection, that is, a mixture accelerator 19 on a side wall in the mixing channel 18 for connecting the respective returning channels 3b of the channels 3A and 3B is provided to form an upper channel 20 and a lower channel 21 in the mixing channel 18. On the other hand, in the mixing channel 18 for connecting the respective going channels 3a of the channels 3A and 3B, the going channels 3a located at the both ends of the heat sink 100, provided are partition plates 22 for making partitions between the returning channels 3b and the going channels 3a. The partition plate 22 is arranged to be provided with an opening 23 so that each going channel 3a would be connected to any one of the upper channel 20 and the lower channel 21.

This allows the cooling fluid 9 flowing in the respective going channels 3a of the channels 3A and 3B of the heat sink 100 to flow from the openings 23 respectively provided in the partition plates 22 into the upper channels 20 or the lower channels 21 in the mixing channel 18 and to be mixed in the mixing channel 18 connected with the returning channels 3b, so that the mixed cooling fluid 9 can flow in the respective returning channels 3b of the channels 3A and 3B.

In the heat sink 100 in FIG. 9, the header for distribution 2 communicates with each of the going channels 3a of the respective channels 3A and 3B through the connecting channel 16c while the header for confluence 5 communicates with each of the returning channels 3b of the respective channels 3A and 3B through the connecting channel 16d.

In FIGS. 8 and 9, a direction almost vertical to an extending lines of the going channels 3a and the returning channels 3b of the channels 3A and 3B is also defined as a longitudinal direction of the header for distribution 2 and the header for confluence 5. The cooling fluid 9 is sent from the cooling fluid inlet 1 in the longitudinal direction of the header for distribution 2. The cooling fluid is discharged from the cooling fluid outlet 6 in the longitudinal direction of the header for confluence 5. Especially, the header for distribution 2 is connected in its longitudinal direction to the respective going channels 3a of the channels 3A and 3B. Accordingly, the cooling fluid sent in the longitudinal direction of the header for distribution 2 allows the going channels 3a of the channels 3A and 3B to be supplied with the almost equal cooling fluid.

In FIG. 9, the flowing direction of the cooling fluid is not especially limited. The similar effects can be expected even when a relation in location or functions is exchanged between the cooling fluid inlet 1 and the cooling fluid outlet 6, the header for distribution 2 and the header for confluence 5 or the going channels 3a and the returning channels 3b of the channels 3A and 3B.

Figure 10:
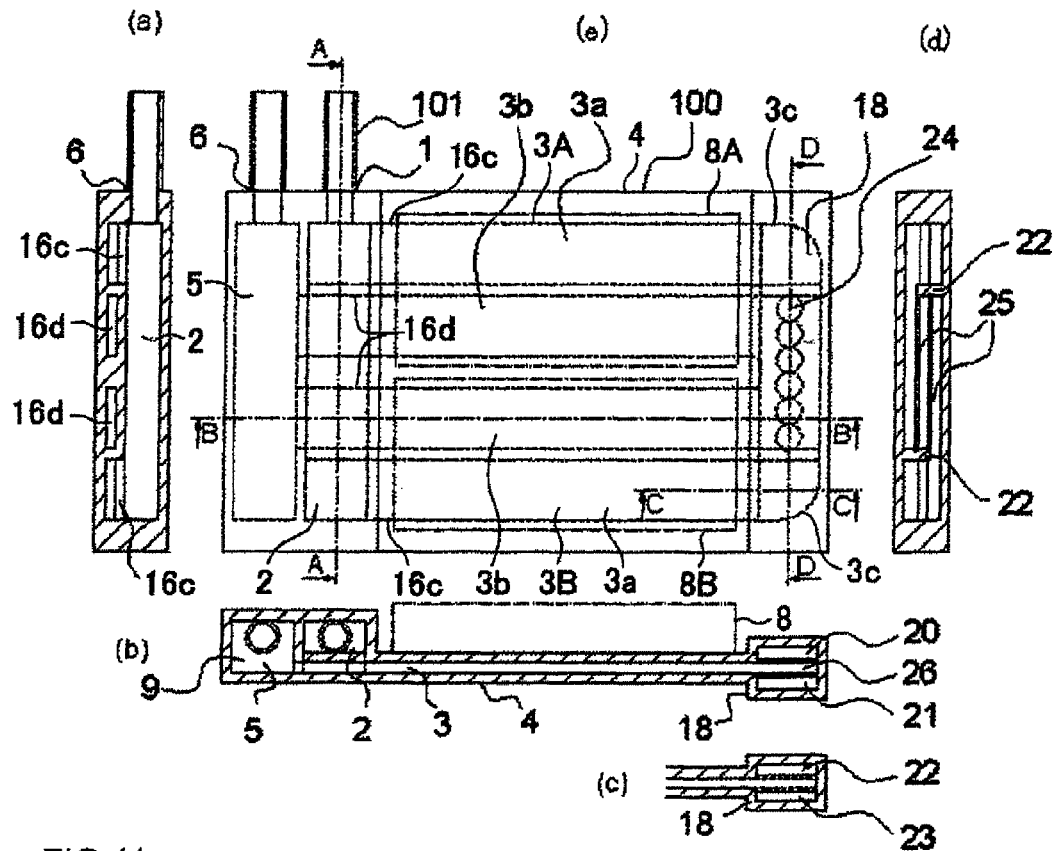
FIG. 10 shows a structure of further another heat sink in accordance with Embodiment 3 of the invention.

FIG. 10 shows further another structure of the heat sink in accordance with Embodiment 3 of the invention. FIG. 10(e) is a top view of the heat sink. FIG. 10(a) is a sectional view taken along a line A-A in FIG. 10(e). FIG. 10(b) is a sectional view taken along a line B-B in FIG. 10(e). FIG. 10(c) is a sectional view taken along a line C-C in FIG. 10(e). FIG. 10(d) is a sectional view taken along a line D-D in FIG. 10(e).

In the heat sink 100 shown in FIG. 10, the respective returning channels 3b of the two channels 3A and 3B are adjacent to each other at the center of the heat transfer vessel 4. Two partition plates 25 provided with plural openings 24 are provided in the mixing channel 18 connected to the respective returning channels 3b of the channels 3A and 3B to form three of upper, middle and lower channels. On the other hand, in the mixing channel 18 connected to the respective going channels 3a of the channels 3A and 3B, the going channels located at the both ends of the heat transfer vessels 4, provided are partition plates 22 for making partition between the returning channels 3b and the going channels 3a. The partition plate 22 is arranged to be provided with an opening 23 so that each going channel 3a would be connected to any one of the upper channel 20 and the lower channel 21. In this case, the cooling fluid 9 flowing in the respective going channels 3a of the channels 3A and 3B, the going channels located at the both ends of the heat transfer vessel 4, flows from the openings 23 provided in the partition plates 22 into the upper channel 20 or the lower channel 21 in the mixing channel 18, flows from the openings 24 provided in plural number in the partition plates 25 into the middle channel 26. The cooling fluid 9 is then mixed in the mixing channel 18 connected to the returning channels 3b. The mixed cooling fluid 9 is thus able to flow in each of the returning channels 3b of the respective channels 3A and 3B.

In the heat sink 100 in FIG. 9, the header for distribution 2 communicates with each of the going channels 3a of the respective channels 3A and 3B through the connecting channel 16c while the header for confluence 5 communicates with each of the returning channels 3b of the respective channels 3A and 3B through the connecting channel 16d.

In FIG. 10, the flowing direction of the cooling fluid is also not specifically limited. The similar effects can be expected even when a relation in location or functions is exchanged between the cooling fluid inlet 1 and the cooling fluid outlet 6, the header for distribution 2 and the header for confluence 5 or the going channels 3a and the returning channels 3b of the channels 3A and 3B.

The above effect can be also expected when the temperature distribution of the cooling fluid is large in a cross section of a channel even in the case of forming one channel 3 in the heat transfer vessel 4. Properly providing the partition plate 22 and the opening 23 allows the effect similar to that of the cases in FIGS. 9 and 10 to be achieved even in the case of providing three or more channels 3 in parallel.

Embodiment 4

Figure 11:
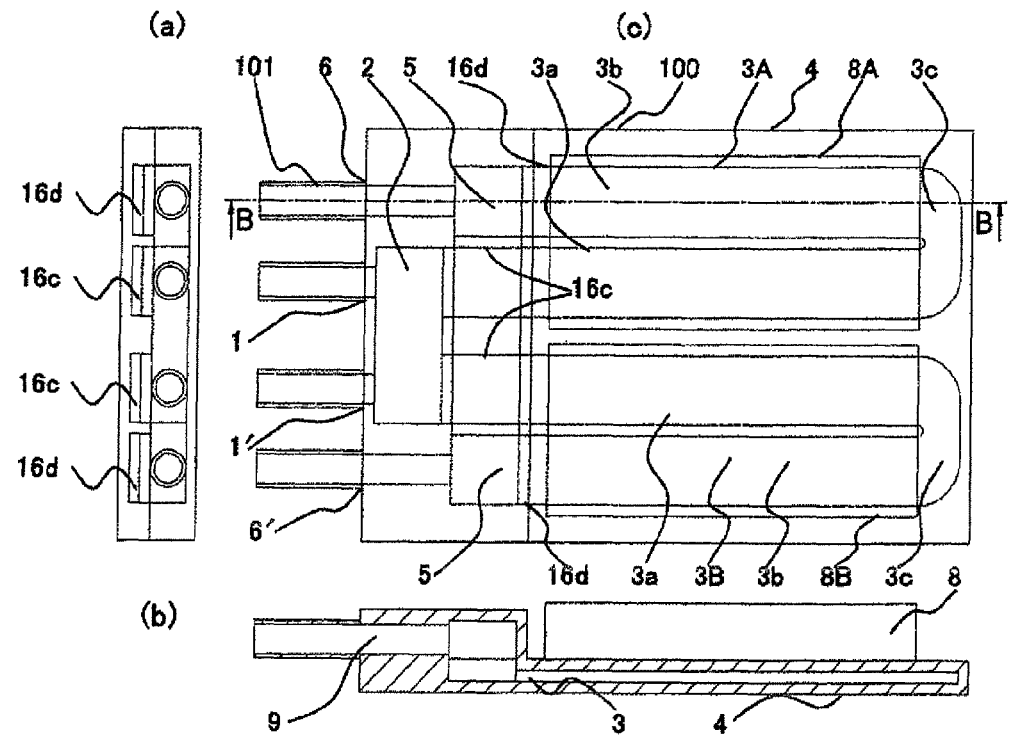
FIG. 11 shows a structure of a heat sink in accordance with Embodiment 4 of the invention.
Figure 12:
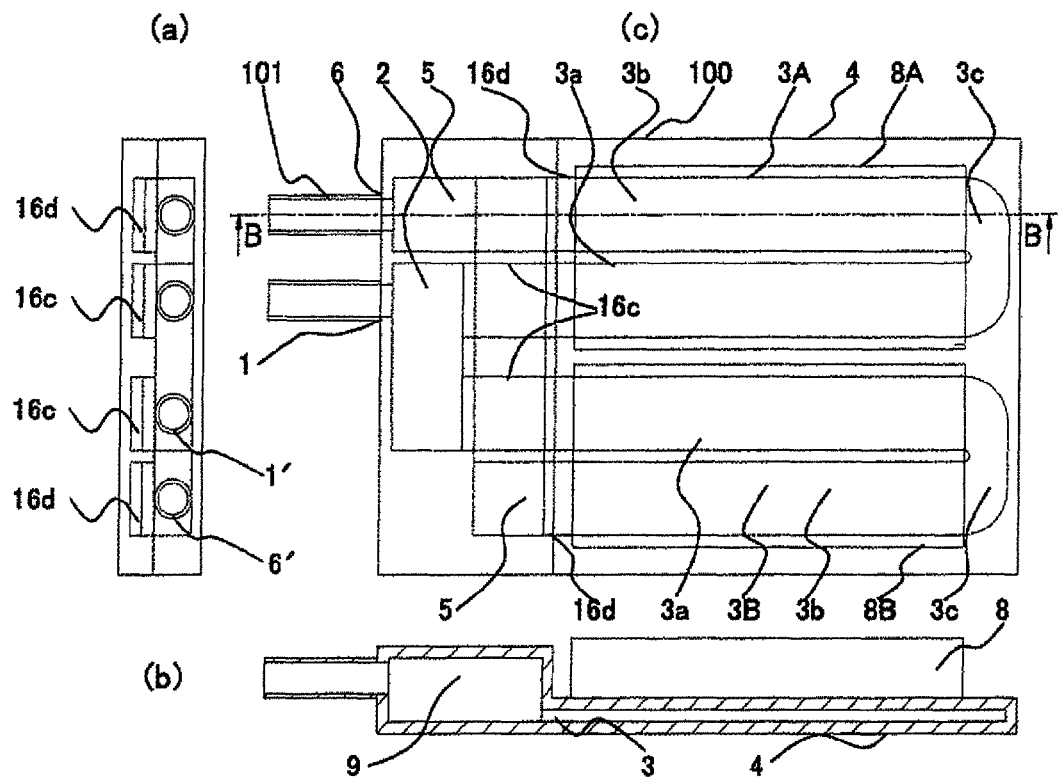
FIG. 12 shows a structure of another heat sink in accordance with Embodiment 4 of the invention.

FIG. 11 shows a simplified structure of a heat sink in accordance with Embodiment 4 of the invention. FIG. 11(c) is a top view of the heat sink. FIG. 11(a) is a left side view of the heat sink. FIG. 11(b) is a sectional view taken along a line B-B in FIG. 11(c). FIG. 12 shows a simplified structure of another heat sink in accordance with Embodiment 4 of the invention. FIG. 12(c) is a top view of the heat sink. FIG. 12(a) is a left side view of the heat sink. FIG. 12(b) is a sectional view taken along a line B-B in FIG. 12(c).

In the heat sink 100 in Embodiment 4, the header for distribution 2 and the header for confluence 5 are provided in parallel on the left side of the heat sink 100 so at to be offset with respect to a surface on which the channels 3A and 3B are provided, as shown in FIGS. 11 and 12. Further, the header for distribution 2 on the left side, namely, the outer side is arranged to be shorter than the header for confluence 5 on the right side, namely, the inner side. The header for distribution 2 communicates with each of the going channels 3a of the respective channels 3A and 3B through the connecting channel 16c. The header for confluence 5 communicates with each of the returning channels 3b of the respective channels 3A and 3B through the connecting channel 16d. In the heat sink 100 shown in FIG. 11, it is arranged that two cooling fluid inlets 1 and 1' be formed for the header for distribution 2 while two cooling fluid outlets 6 and 6' be formed for the header for confluence 5 so that the pipe 101 can be respectively connected to any of the cooling fluid inlets 1 and 1' and any of the cooling fluid outlets 6 and 6'. Accordingly, more flexible pipe laying is available in accordance with a setting condition. In the heat sink 100 shown in FIG. 12, the longer header for confluence 5 on the inner side is formed into the shape of L to be lead to the left side end surface of the heat sink 100. This allows the cooling fluid inlet 1 and the cooling fluid outlet 6 to be provided on the left side end surface of the heat sink 100, namely, a surface crossing at right angles with a direction in which the respective headers 2 and 5 are adjacent. Accordingly, more flexible pipe laying is possible, so that the cooling system can be made compact. The header for confluence 5 of the heat sink 100 shown in FIG. 12 can achieve the similar effect even when it is formed into the shape of C.

Piling the plural heat sinks 100 provided with the pipe 101 on its left side end as shown in FIG. 11 to form a stack structure so as to form a cooling unit in which the plural heat sinks 100 are connected allows pipe mounting places of the respective heat sinks 100 to be unified at the left side upper part or lower part, so that the cooling system can be made more compact. Moreover, the heat sink in Embodiment 4 have five surfaces capable of pipe laying since the left side surface is also possible to be used for laying a pipe although the heat sinks 100 shown in FIGS. 6, 8 and 9 have four surfaces capable of pipe laying. This allows more flexible pipe laying to be achieved. In addition, only three surfaces of the left side surface, the upper surface and the lower surface are the surface from which all the heat sinks can be seen in the case of a stack structure. This is especially effective when the respective heat sinks 100 are connected to independently provided headers in a cooling fluid circulation loop, the headers being provided separately from the respective heat sinks 100.

The respective heat sinks 100 shown in FIGS. 1 to 6 and 8 to 10 have a direction since the headers 2 and 5 are thicker in thickness than the heat transfer vessel 4 and both surfaces of the heat sink 100 are different in shape. Accordingly, one kind of heat sink 100 can be used for forming the above structure in the case of piling the heat sinks 100 in a same direction, but two kinds of heat sinks 100 in which places for providing the cooling fluid inlet 1 and the cooling fluid outlet 6 are different should be used in the case of piling the heat sinks 100 so as to be faced to each other. Providing the cooling fluid inlets 1 and 1' and the cooling fluid outlets 6 and 6' respectively on both of the upper and lower ends of the both headers 2 and 5, however, allows the cooling fluid inlets and the cooling fluid outlets to be respectively provided at the same height in the upper and lower parts on the left side of the heat sinks 100 in the stack structure even in the face-to-face piling structure. Accordingly, upper or lower cooling fluid inlet and outlet can be selected for laying pipes. Sealing another set of unselected cooling fluid inlet and outlet with a water-cutoff cap and such (including a drain valve) allows the heat sinks to be more flexibly combined to form a cooling unit. The similar effect can be achieved in FIGS. 1 to 6 and 8 to 10 by similarly providing the cooling fluid inlets 1 and 1' and the cooling fluid outlets 6 and 6' respectively on both of the upper and lower ends.

Figure 13:
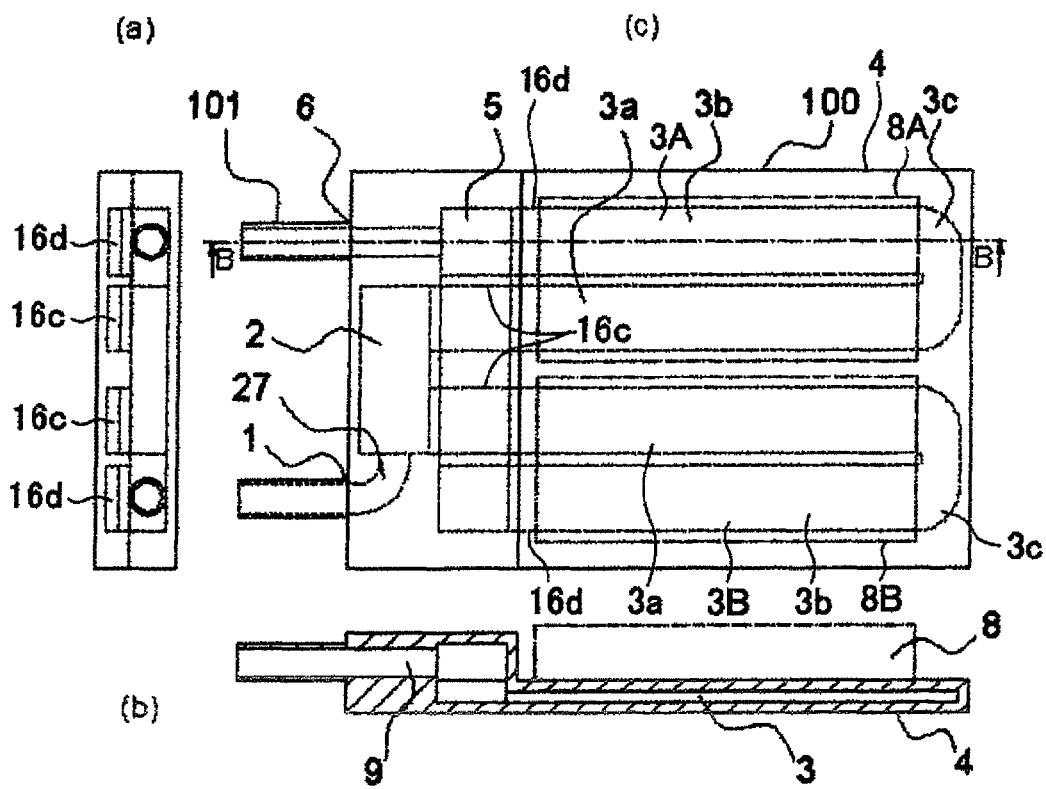
FIG. 13 shows a structure of further another heat sink in accordance with Embodiment 4 of the invention.

Furthermore, in FIG. 11, the cooling fluid 9 is arranged to flow into the header for distribution 2 or from the header for confluence 5 so as to cross at right angles with the headers. A direction that the cooling fluid is sent to the header for distribution 2 is same as a direction that the cooling fluid is sent to the channels 3A and 3B. Accordingly, much more cooling fluid 9 flows into one of the channels 3A and 3B, the one being closer to a part from which the cooling fluid 9 is sent in the header for distribution 2. This causes a one-sided drift in the respective channels 3A and 3E or a difference in drift between the respective channels 3A and 3B in some cases. Providing a curved channel 27 between the cooling fluid inlet 1 and the header for distribution 2 as shown in FIG. 13 to arrange the cooling fluid 9 to flow in the longitudinal direction of the header for distribution 2, namely, a direction crossing at right angles with a flowing direction of the cooling fluid in the channels 3A and 3B allows flowing conditions at the ends of the respective channels 3A and 3B to comparatively resemble each other since the cooling fluid in the header for distribution 2 is different in flowing direction from the cooling fluid in the channels 3A and 3B. This allows the one-sided drift to be kept down.

The curved channel 27 may be also provided in the connecting part between the header for confluence 5 and the cooling fluid outlet 6 in the case that the header for confluence 5 is provided on the outer side. In this case, the cooling fluid 9 is sent in the longitudinal direction of the header for confluence 5, so that substantially equal cooling fluid can be discharged from the returning channels 3b of the respective channels 3A and 3B.

Embodiment 5

Figure 14:
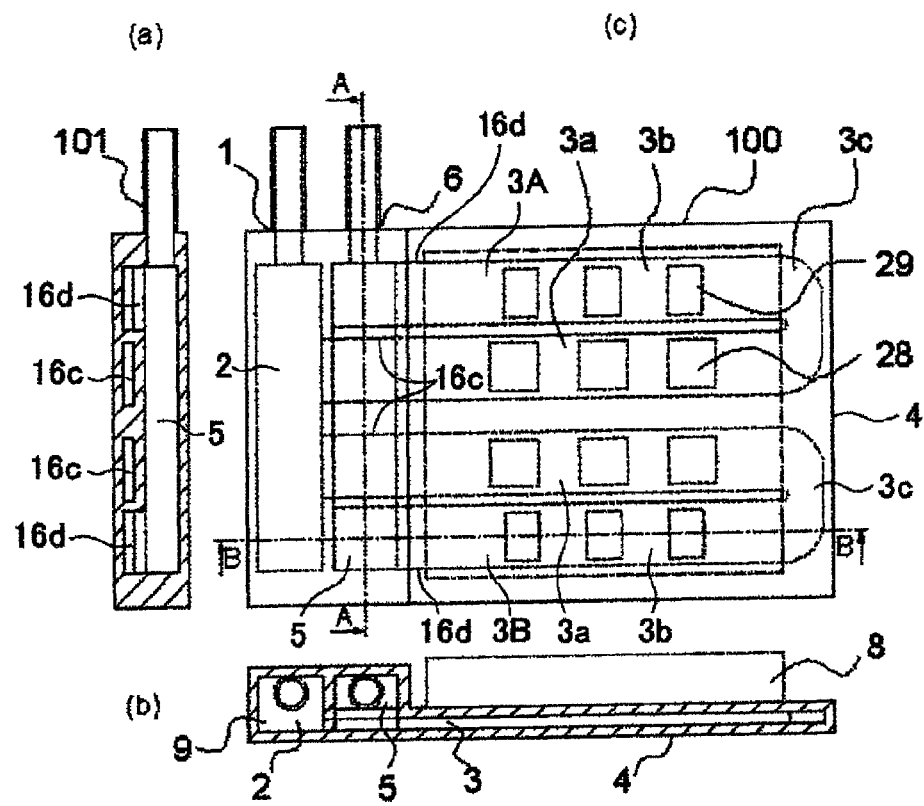
FIG. 14 shows a structure of a heat sink in accordance with Embodiment 5 of the invention.

FIG. 14 shows a simplified structure of a heat sink in accordance with Embodiment 5 of the invention. FIG. 14(*c*) is a top view of the heat sink. FIG. 14(*a*) is a sectional view taken along a line A-A in FIG. 14(*c*). FIG. 14(*b*) is a sectional view taken along a line B-B in FIG. 14(*c*).

Embodiment 5 is an example of an optimum arrangement of plural heating elements 8 including a high heat generating source 28 and a low heat generating source 29 in the heat sink 100 in accordance with the invention. As typical electronics having high heating density, considered can be a power module. The power module is formed chiefly from two tips of an IGBT and a diode, which are provided on a substrate. The power module is often provided comparatively regularly in an even-numbered column. Any one of the IGBT and the diode generates heat more than the other in many cases although it depends on a condition under which the power module is used, and therefore, the heat sink 100 is usually used for cooling for the purpose of keeping the temperature of any high heating element 28 under a permissible temperature. In Embodiment 5, defined as the high heat generating source 28 is not what has a larger calorific value but what has a larger heat flux, namely, a larger calorific value per a unit area. As the low heat generating source 29, defined is what includes a heat generating source other than the high heat generating source 28.

In FIG. 14, such plural high heat generating sources 28 are provided along the respective going channels 3a of the channels 3A and 3B while the plural low heat generating sources 29 are provided along the respective returning channels 3b of the channels 3A and 3B.

Such a structure allows the cooling fluid 9 of a low temperature to receive heat chiefly from lines of the high heat generating sources 28 to rise in temperature in passing through the going channels 3a of the respective channels 3A and 3B. The cooling medium 9 having risen in temperature returns through the U-turn channel 3c. In passing through the returning channels 3b of the respective channels 3A and 3B, the cooling medium 9 receives heat from lines of the low heat generating sources 29 to further rise in temperature. The cooling fluid 9 of high temperature is then discharged from the cooling fluid outlet 6 through the header for confluence 5. Accordingly, the cooling fluid 9 of lower temperature cools the lines of the high heat generating sources 28 while, on the other hand, the cooling fluid 9 having received heat and risen in temperature in passing through the going channels 3a cools the lines of the low heat generating sources 29. This causes a rise in maximum temperature of the lines of the low heat generating sources 29 differently from the case of cooling both of the heat generating sources in any one of the going channel and the returning channel. The maximum temperature of the lines of the high heat generating sources 28, however, decreases, the deviation in temperature in the heating element 8 is reduced, the uniformity of heat is accelerated, and further, the maximum temperature of the high heat generating sources 28, which is the most important, decreases, so that the heat characteristic is improved.

In the heat sink 100 in FIG. 14, the header for distribution 2 communicates with each of the going channels 3a of the respective channels 3A and 3B through the connecting channel 16c while the header for confluence 5 communicates with each of the returning channels 3b of the respective channels 3A and 3B through the connecting channel 16d.

Figure 15:
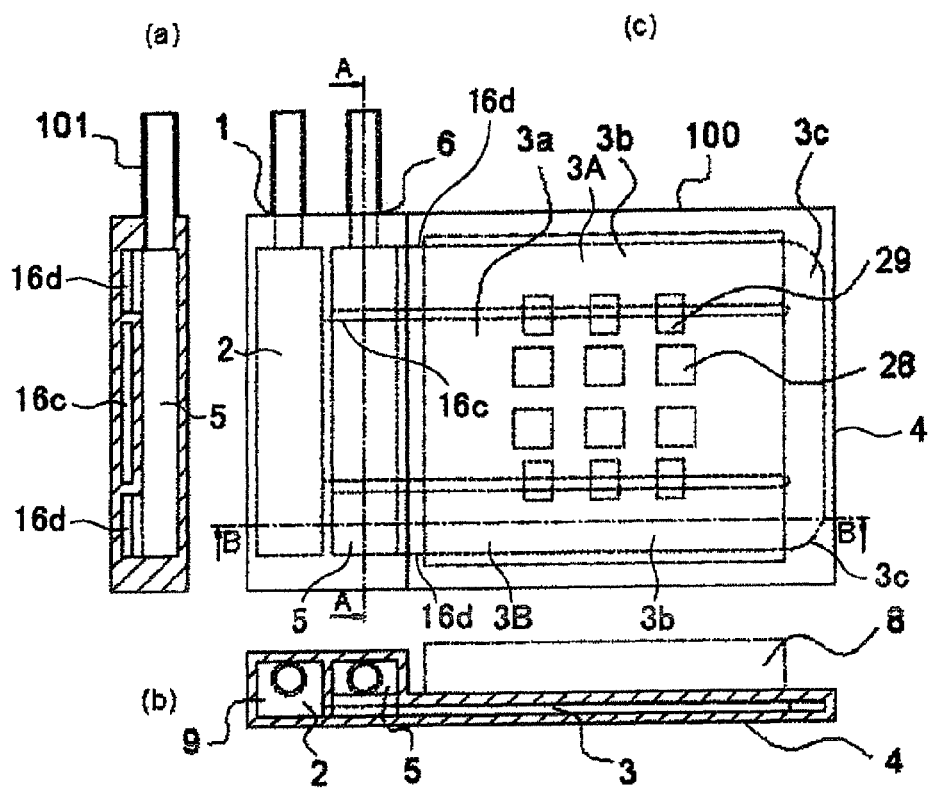
FIG. 15 shows a structure of another heat sink in accordance with Embodiment 5 of the invention.

FIG. 15 shows a simplified structure of another heat sink in accordance with Embodiment 5 of the invention. FIG. 15(c) is a top view of the heat sink. FIG. 15(a) is a sectional view taken along a line A-A in FIG. 15(c). FIG. 15(b) is a sectional view taken along a line B-B in FIG. 15(c). In the heat sink 100 in FIG. 15, the going channels 3a of the channels 3A and 3B in the heat sink 100 in FIG. 14 are formed to be common. In the plural heating elements 8 including the high heat generating sources 28 and the low heat generating sources 29, a chief heat generating source group including plural high heat generating sources 28 is provided in two rows along the going channel 3a while a chief heat generating source peripheral part including plural low heat generating sources 29 is provided in two rows so as to be bridged between the going channel 3a and the returning channel 3b. In the heat sink 100 in FIG. 14, the two channels 3A and 3B are formed on a same plane independently from each other. In the heat sink 100 in FIG. 15, however, the going channels 3a of the channels 3A and 3B are formed in common. The goring channel 3a formed in common communicates with the returning channels 3b of the channels 3A and 3B through the U-turn channels 3c, respectively. The heat sink 100 in FIG. 15 can also achieve an effect similar to that of the heat sink 100 in FIG. 14.

In the heat sink 100 in FIGS. 14 and 15, shown is an example that the high heat generating sources 28 are provided at the center of the heat transfer vessel 4. The high heat generating source 28, however, may be provided on the outer side. Any structure is possible so long as the high heat generating source 28 or the chief heat generating source group is mainly cooled in the going channel 3a while the low heat generating source 29 or the chief heat generating source peripheral part is mainly cooled in the returning channel 3b. In other words, any structure is considerable as long as a heat generating source mounting part, which is most difficult to satisfy the permissible temperature, is cooled in the going channel 3a and the other part is cooled in the returning channel 3b.

Embodiment 6

Figure 16:
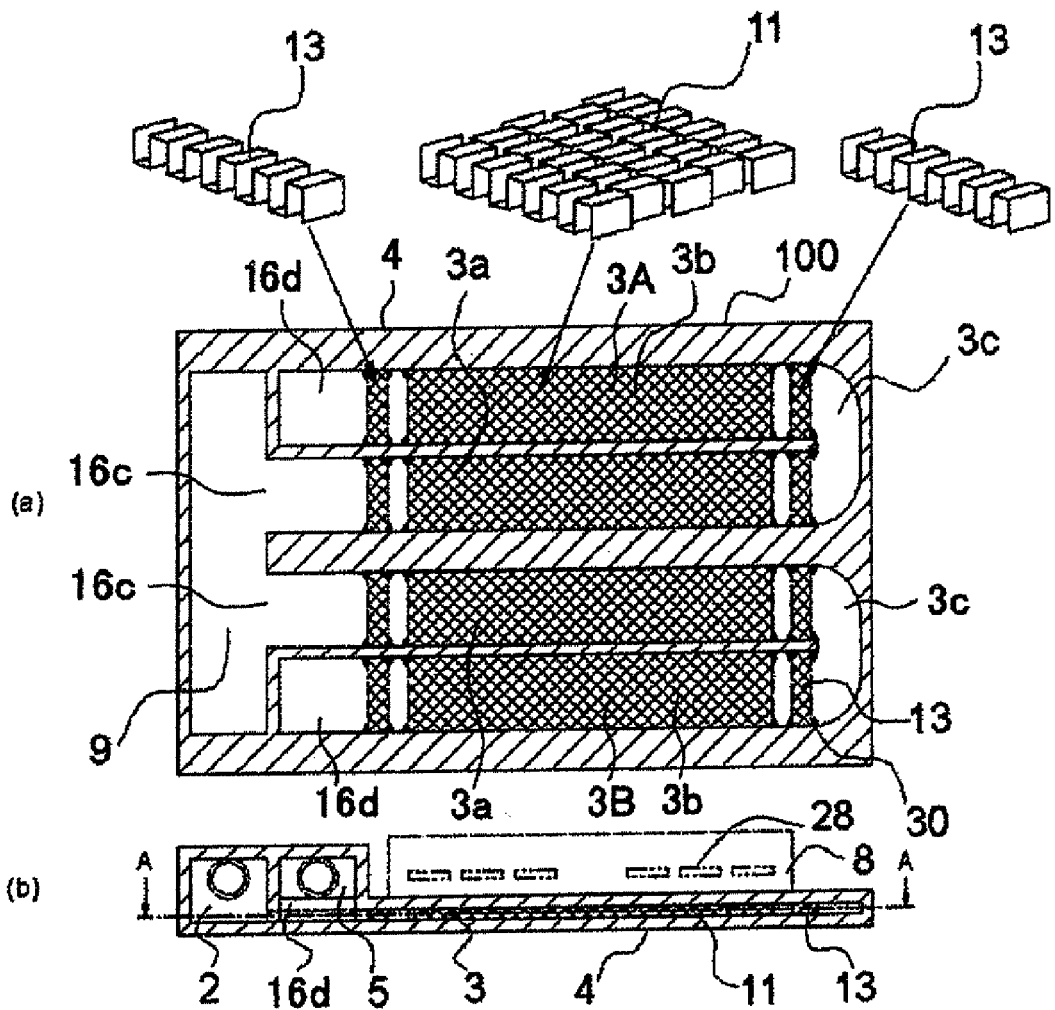
FIG. 16 shows a structure of a heat sink in accordance with Embodiment 6 of the invention.

FIG. 16 shows a simplified structure of a heat sink in accordance with Embodiment 6 of the invention. FIG. 16(b) is a side sectional view of the heat sink in accordance with Embodiment 6. FIG. 16(a) is a sectional view taken along a line A-A in FIG. 16(b). FIG. 16(a) also includes perspective views of the heat transfer accelerator 11 and a rectifying structure 13.

In the heat sink 100 in Embodiment 6, the heat transfer accelerators 11 of the length almost same as the heating element mounting length in the flowing direction of the cooling fluid are provided in the respective going channels 3a and the respective returning channels 3b of the channels 3A and 3B provided just under the heating element mounting surface, as shown in FIG. 16. Further, a rectifying structure 13 is provided on at least one of an upstream side and a downstream side of the heat transfer accelerator 11 at an interval to the heat transfer accelerator 11. The length of the heat transfer accelerator 11 is defined to be the length of the channel thermally connected to a heat transfer surface between a heat generating source located on the upstream side and a heat generating source located on the most downstream side along the going channel 3a and the returning channel 3b, respectively, in the case of mounting a heating element including a heat generating source such as plural IGBTs, for example, that is, a power module, for example. Fixing projections 30 are provided respectively on wall surfaces of the channels 3A and 3B where the ends of the heat transfer accelerator 11 and the rectifying structure 13 are located.

Such arrangement causes the one-sided drift in the channels 3A and 3B to be rectified by means of the rectifying structure 13 and the cooling fluid 9 whose flow has been evened to pass through the heat transfer accelerators 11. Accordingly, heat is effectively transferred to the cooling fluid 9 from the heating element 8, so that the heat transfer characteristic is improved. Moreover, a hot spot due to a one-sided drift or breakaway of the cooling fluid can be kept down.

It is also arranged in the heat sink 100 in FIG. 16 that the header for distribution 2 communicate with each of the going channels 3a of the respective channels 3A and 3B through the connecting channel 16c while the header for confluence 5 communicate with each of the returning channels 3b of the respective channels 3A and 3B through the connecting channel 16d.

The fixing projections 30 are provided on the wall surfaces of the channels 3A and 3B in the heat sink 100 in FIG. 16. On the wall surfaces of the channels 3A and 3B, however, may be provided fixing concaves to which the heat transfer accelerator 11 and the rectifying structure 13 can be mounted.

Furthermore, as for the rectification reinforcement described in Embodiment 1, it may be fixed in a channel by means of a similar fixing projection 30 or a similar fixing concave.

The length of the heat transfer accelerator 11 in the flowing direction of the cooling fluid may be longer than the heating element mounting length. In this case, however, the periphery of the heating element is excessively cooled, and thereby, the deviation in temperature in the heating element mounting surface is increased. Moreover, increase in loss in pressure deteriorates a fluid characteristic and a heat transfer characteristic. In Embodiment 6, however, provided are the heat transfer accelerator 11 whose length is almost same as the heating element mounting length in the flowing direction, that is, a little shorter than the heating element mounting length in FIG. 16 and the rectifying structure 13, which is spaced from the heat transfer accelerator 11 and which is provided at a place hardly connected thermally to the heating element. This allows a one-sided drift to be prevented by means of the rectifying structure 13. In addition, there is no excessive cooled part described above, and thereby, the deviation in temperature in the heating element mounting surface decreases, so that the uniformity of heat can be improved.

The length of an interval between the heat transfer accelerator 11 and the rectifying structure 13 is preferably twice or more as long as the hydraulic equivalent diameter in the rectifying structure 13. Such length allows a rectification effect to be achieved. Further, more effective is the length of the interval five times or more as long as the hydraulic equivalent diameter.

In the case of using an insertion as the heat transfer accelerator 11, providing the fixing projection 30 or a fixing concave as shown in FIG. 16 allows positioning of the heat transfer accelerator 11 and the rectifying structure 13 to be accurately carried out and a manufacturing operation to be easily performed.

Figure 17:
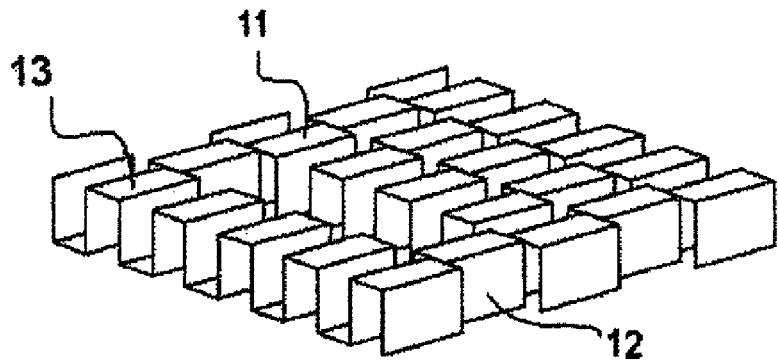
FIG. 17 is a perspective view showing an integrated structural body of a rectifying structure and a heat transfer accelerator in accordance with Embodiment 6 of the invention.

Further, it may be also possible to use an integrated structural body formed from the rectifying structure 13 and the heat transfer accelerator 11, which are connected by means of a connecting part 12, as shown in FIG. 17.

Embodiment 7

Figure 18:
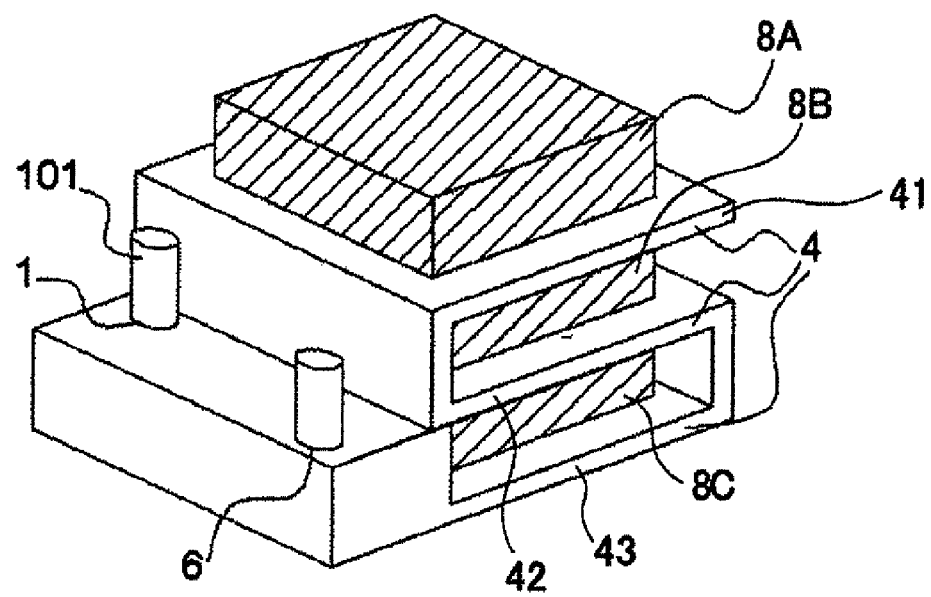
FIG. 18 is a structural view showing a heat sink in accordance with Embodiment 7 of the invention.
Figure 19:
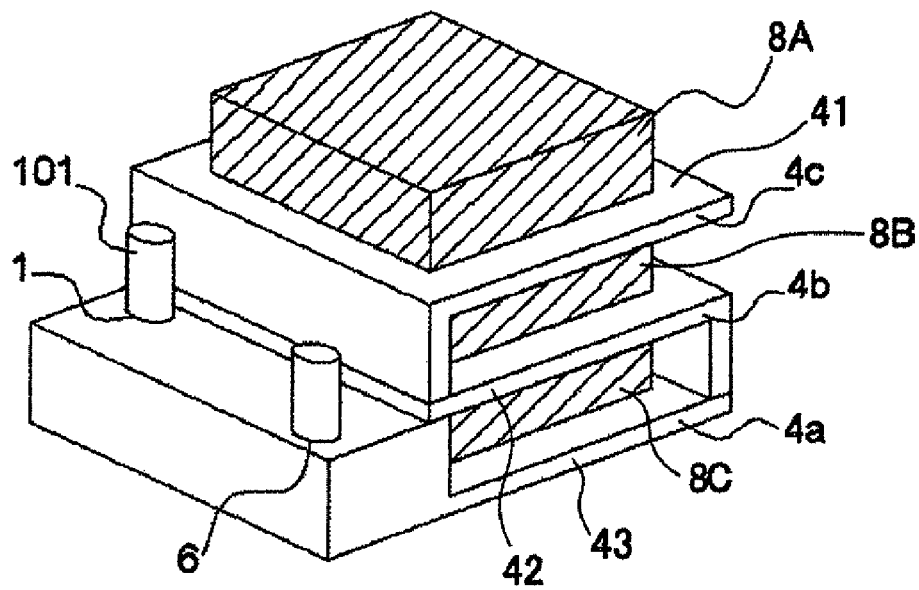
FIG. 19 is a structural view showing another heat sink in accordance with Embodiment 7 of the invention.

FIG. 18 is a simplified perspective view of a heat sink in accordance with Embodiment 7 of the invention. FIG. 19 is a simplified perspective view of another heat sink in accordance with Embodiment 7 of the invention.

In the heat sink in Embodiment 7, the heat transfer vessel 4 is formed into a folded structure so as to have a cross section substantially in the shape of S and includes three flat heat transfer vessel layers 41, 42 and 431 as shown in FIG. 18. The three heat transfer vessel layers 41, 42 and 43 of the heat transfer vessel 4 are provided with the heating elements 8A, 8B and 8C, respectively. This allows a compact heat sink, which cools the plural heating elements 8A, 8B and 8C, to be provided. The heat transfer vessel layers 41, 42 and 43 are respectively formed similarly to the heat transfer vessels 4 in Embodiments 1 to 4.

FIG. 19 shows a heat sink or a cooling unit, which is formed by dividing the heat transfer vessel 4 having a cross section substantially in the shape of S into plural vessel members 4a, 4b and 4c to connect the divided vessel members 4a, 4b and 4c with each other. Dividing the heat transfer vessel 4 allows manufacture to be easily carried out. The vessel members 4a, 4b and 4c respectively have the heat transfer vessel layers 41, 42 and 43.

The heating elements 8A, 8B and 8C may be arranged to be cooled only from one surface or from both surfaces.

In Embodiment 7, the heat transfer vessel 4 is preferable to be formed from a material having flexibility. That is to say, intervals between adjacent heat transfer vessel layers 41, 42 and 43 among the heat transfer vessel layers 41, 42 and 43 of the heat transfer vessel 4 are widened a little to mount the heating elements 8A, 8B and 8C, and then, all the above is sandwiched together. This allows the thermal contact between the heating elements 8A, 8B and 8C and the heat transfer vessel layers 41, 42 and 43 to be improved. The air-tightness of the channels 3A and 3B can be improved when the opening 15 described in Embodiment 1 is provided in the heat transfer vessel 4. Moreover, in the case that the heat transfer vessel 4 is divided, the divided heat transfer vessels 4a, 4b and 4c can be easily connected.

The heat transfer vessel 4 has a cross section substantially in the shape of S in Embodiment 7 shown in FIGS. 18 and 19. The heat transfer vessel 4, however, is not specifically limited in structure so long as it has a folded structure substantially in the shape of a wave such as a substantial U shape and a substantial W shape and the heating element is held between the folded layers.

Embodiment 8

Figure 20:
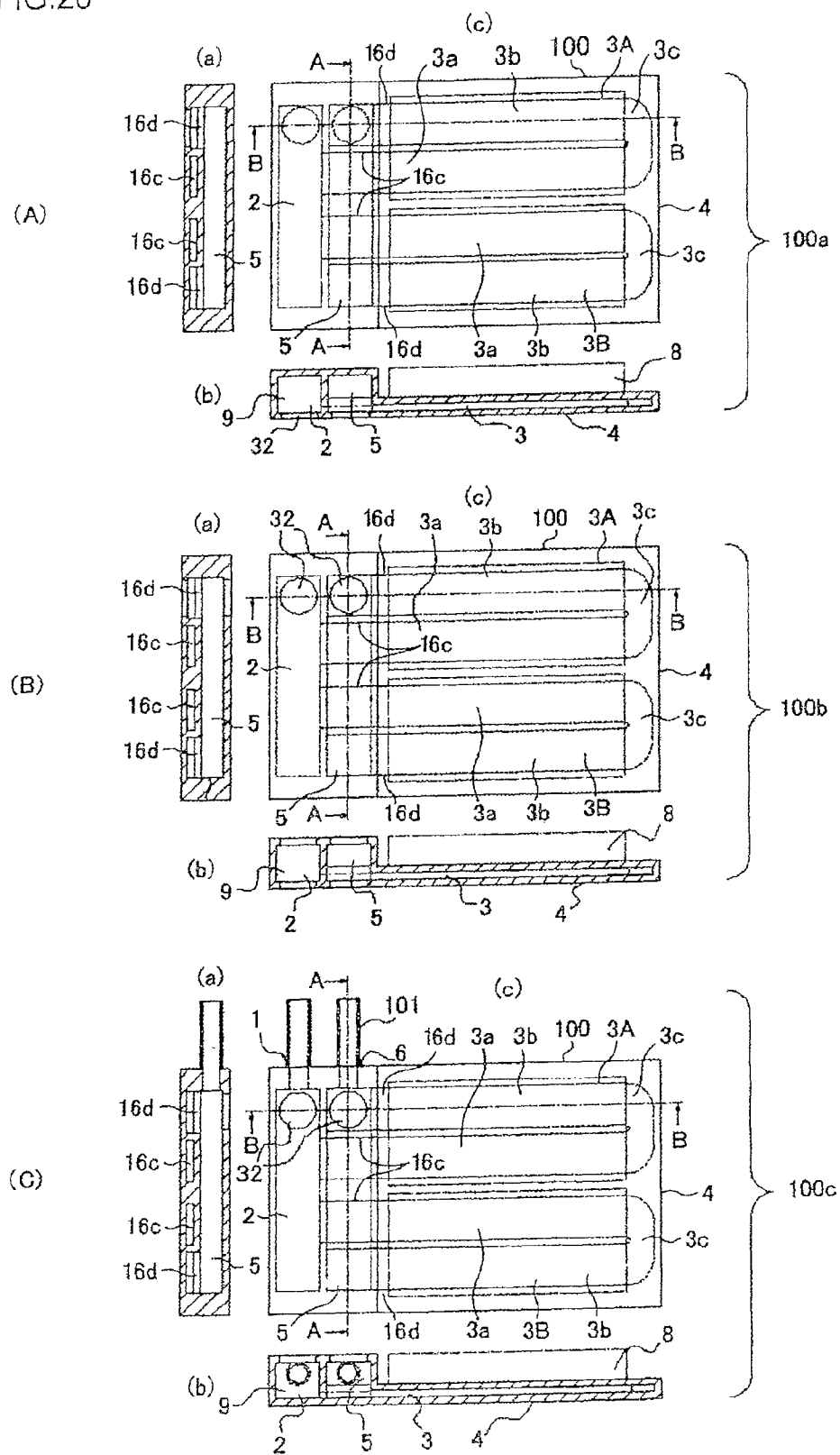
FIG. 20 shows a cooling unit in accordance with Embodiment 8 of the invention.

FIG. 20 shows a simplified cooling unit in accordance with Embodiment 8 of the invention for every component. FIG. 20(A) shows an upper heat sink 100a. FIG. 20(B) shows a middle heat sink 100b. FIG. 20(C) shows a lower heat sink 100c. The heat sinks 100a, 100b and 100c are piled in three layers to form a cooling unit. In each of FIGS. 20(A), 20(B) and 20(C), (c) is a top view of the heat sink in each layer, (a) is a sectional view taken along a line A-A in (c) and (b) is a sectional view taken along a line B-B in (c).

The lower heat sink 100c shown in FIG. 20(C) is a heat sink having a structure similar to that of Embodiment 2 shown in FIG. 6, for example, the heat sink being provided with connecting openings 32 in upper surfaces of the header for distribution 2 and the header for confluence 5, namely, a piling surface on which the middle heat sink 100b is piled. The middle heat sink 100b shown in FIG. 20(B) is a heat sink having a structure similar to that of Embodiment 2 shown in FIG. 6, for example, the heat sink being provided with no cooling fluid inlet 1 and no cooling fluid outlet 6 and with connecting openings 32 in upper and lower surfaces of the header for distribution 2 and the header for confluence 5, namely, piling surfaces on which the upper and lower heat sinks 100a and 100c are piled. The upper heat sink 100a shown in FIG. 20(A) is a heat sink having a structure similar to that of Embodiment 2 shown in FIG. 6, for example, the heat sink being provided with no cooling fluid inlet 1 and no cooling fluid outlet 6 and with connecting openings 32 in lower surfaces of the header for distribution 2 and the header for confluence 5, namely, a piling surface on which the middle heat sink 100b is piled. A cooling unit shown in FIG. 20 in accordance with Embodiment 8 is formed from the heat sinks 100a, 100b and 100c, which have the above structures, piled in three layers so that the channels 3A and 3B of the respective heat sinks 100a, 100b and 100c would be provided in parallel to each other via the connecting openings 32.

In all of the heat sinks 100a, 100b and 100c, the header for distribution 2 communicates with the going channels 3a of the respective channels 3A and 3B through the connecting channels 16c while the header for confluence 5 communicates with the returning channels 3b of the respective channels 3A and 3B through the connecting channels 16d.

Figure 21:
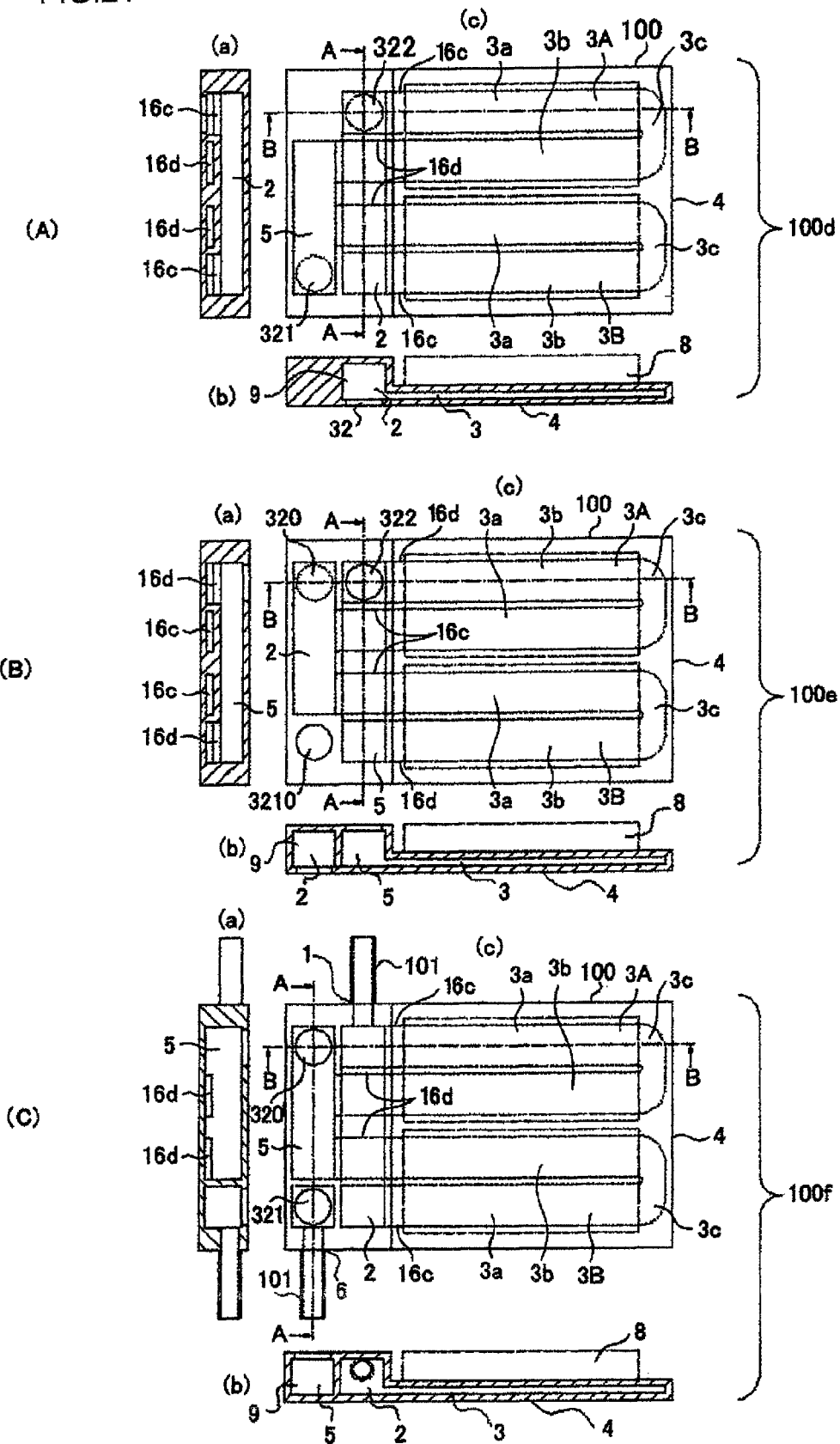
FIG. 21 shows another cooling unit in accordance with Embodiment 8 of the invention.

FIG. 21 shows another simplified cooling unit in accordance with Embodiment 8 of the invention for every component. FIG. 21(A) shows an upper heat sink 100d. FIG. 21(B) shows a middle heat sink 100e. FIG. 21(C) shows a lower heat sink 100f. The heat sinks 100d, 100e and 100f are piled in three layers to form a cooling unit. In each of FIGS. 21(A), 21(B) and 21(C), (c) is a top view of the heat sink in each layer, (a) is a sectional view taken along a line A-A in (c) and (b) is a sectional view taken along a line B-B in (c).

The lower heat sink 100f shown in FIG. 21(C) is arranged to be provided with the cooling fluid inlet 1 at the end of the header for distribution 2 and with a connecting opening 320 in an upper surface of the header for confluence 5, namely, a piling surface on which the middle heat sink 100e is piled. The lower heat sink 100f is also arranged so that a connecting opening 321 provided in the upper surface of the heat sink, namely, on the piling surface on which the middle heat sink 10e is piled would communicate with the cooling fluid outlet 6 separately from the header for confluence 5. In the lower heat sink 100f, the cooling fluid inlet 1 is provided in the upper end surface of the header 2 as shown in FIG. 21(C). The cooling fluid inlet 1 may be provided on an end surface opposite to the above. The header for distribution 2 of the lower heat sink 100f communicates with the going channels 3a of the respective channels 3A and 3B through the connecting channels 16c. The header for confluence 5 communicates with the returning channels 3b of the respective channels 3A and 3B through the connecting channels 16d.

The middle heat sink 100e shown in FIG. 21(B) is arranged to be provided with no cooling fluid inlet 1 and no cooling fluid outlet 6 and with a connecting opening 320 in a lower surface of the header for distribution 2, namely, a piling surface on which the lower heat sink 100f is piled and a connecting opening 322 in an upper surface of the header for confluence 5, namely, a piling surface on which the upper heat sink 100d is piled. The middle heat sink 100e is also arranged so that a connecting channel 3210 for connecting a connecting opening 321 of the lower heat sink 100f and an connecting opening 321 of the upper heat sink 100d would be provided separately from the header for distribution 2 and the header for confluence 5. The header for distribution 2 of the middle heat sink 100e communicates with the going channels 3a of the respective channels 3A and 3B through the connecting channels 16c. The header for confluence 5 communicates with the returning channels 3b of the respective channels 3A and 3B through the connecting channels 16d.

The upper heat sink 100d shown in FIG. 21(A) is arranged to be provided with no cooling fluid inlet 1 and no cooling fluid outlet 6 and with a connecting opening 322 in a lower surface of the header for distribution 2, namely, a piling surface on which the middle heat sink 100e is piled and a connecting opening 321 on a lower surface of the header for confluence 5, namely, a piling surface on which the middle heat sink 100e is piled. The header for distribution 2 of the upper heat sink 100d communicates with the going channels 3a of the respective channels 3A and 3B through the connecting channels 16c. The header for confluence 5 communicates with the returning channels 3b of the respective channels 3A and 3B through the connecting channels 16d.

The cooling unit shown in FIG. 21 is formed from the heat sinks 100d, 100e and 100f, which are piled in three layers so that the channels 3A and 3B of the respective heat sinks 100d, 100e and 100f would be provided in series.

Figure 22:
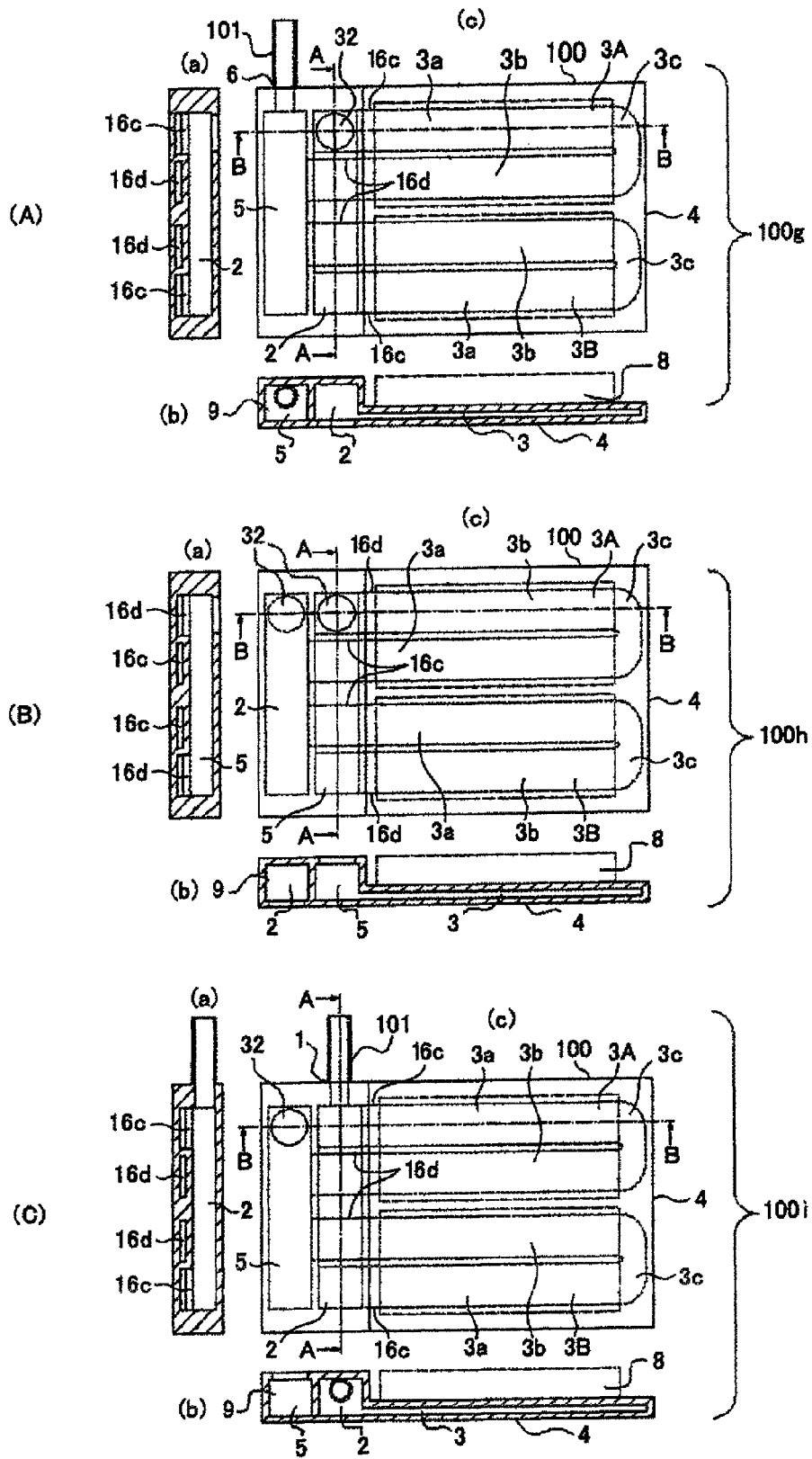
FIG. 22 shows further another cooling unit in accordance with Embodiment 8 of the invention.

FIG. 22 shows further another simplified cooling unit in accordance with Embodiment 8 of the invention for every component. FIG. 22(A) shows an upper heat sink 100g. FIG. 22(B) shows a middle heat sink 100h. FIG. 22(C) shows a lower heat sink 100i. The heat sinks 100g, 100h and 100i are piled in three layers to form a cooling unit. In each of FIGS. 22(A), 22(B) and 22(C), (c) is a top view of the heat sink in each layer, (a) is a sectional view taken along a line A-A in (c) and (b) is a sectional view taken along a line B-B in (c).

The lower heat sink 100i shown in FIG. 22(C) is arranged to be provided with no cooling fluid outlet 6 and with the cooling fluid inlet 1 at the end of the header for distribution 2 and a connecting opening 32 in an upper surface of the header for confluence 5, namely, a piling surface on which the middle heat sink 100h is piled. The header for distribution 2 of the lower heat sink 100i communicates with the going channels 3a of the respective channels 3A and 3B through the connecting channels 16c. The header 5 for confluence communicates with the returning channels 3b of the respective channels 3A and 3B through the connecting channels 16d.

The middle heat sink 100h shown in FIG. 22(B) is arranged to be provided with no cooling fluid inlet 1 and no cooling fluid outlet 6 and with connecting openings 32 in a lower surface of the header for distribution 2, namely, a piling surface on which the lower heat sink 100i is piled and in an upper surface of the header for confluence 5, namely, a piling surface on which the upper heat sink 100g is piled. The header for distribution 2 of the middle heat sink 100h communicates with the going channels 3a of the respective channels 3A and 3B through the connecting channels 16c. The header 5 for confluence communicates with the returning channels 3b of the respective channels 3A and 3B through the connecting channels 16d.

The upper heat sink 100g shown in FIG. 22(A) is arranged to be provided with no cooling fluid inlet 1 and with a connecting opening 32 in a lower surface of the header for distribution 2, namely, a piling surface on which the middle heat sink 100h is piled and the cooling fluid outlet 6 at the end of the header for confluence 5. The header for distribution 2 of the upper heat sink 100g communicates with the going channels 3a of the respective channels 3A and 3B through the connecting channels 16c. The header 5 for confluence communicates with the returning channels 3b of the respective channels 3A and 3B through the connecting channels 16d.

The cooling unit shown in FIG. 22 is formed from the heat sinks 100g, 100h and 100i, which are piled in three layers so that the channels 3A and 3B of the respective heat sinks 100g, 100h and 100i would be provided in series.

Such a structure allows the plural heat sinks to be easily piled, so that a compact cooling unit can be provided.

Structures and connecting methods of the connecting openings 32, 320, 321 and 322 are not specifically limited so long as the connecting openings 32, 320, 321 and 322 can be connected with each other so that the cooling fluid 9 would flow therein. Two connecting openings may be connected directly, through an O-ring or a gasket or via a flowing pipe (including a bend and an elbow), for example.

Further, in Embodiment 8, shown is an example that the connecting opening 32 is provided in the upper or lower surfaces of the headers 2 and 5. The invention, however, is not specifically limited to the above. The cooling unit may be arranged to be provided with connecting openings in side walls of the headers 2 and 5 to connect the connecting openings so that the channels 3A and 3B of the respective heat sinks would be provided in series or in parallel by means of a U-shaped bend.

Moreover, in Embodiment 8, exemplified is a stack structure formed from plural piled heat sinks. The plural heat sinks, however, may be provided on any surfaces to be connected with each other.

The plural heat sinks may also be provided on any surfaces so that the headers 2 and 5 would be faced to each other so as to be connected with each other. A structure of integration is not specifically limited so long as the cooling unit is formed from a combination of plural heat sinks.

A method of mounting each of the heat sinks is not specifically limited. The heat sinks may be connected respectively by means of fixing jigs (such as a bolt and nut) or mounted to frames or such.

A projection in contact with a heat sink may be provided on at least any one of the four corners of another heat sink in order to prevent a change in form of the heat sink.

In addition, the structural strength is reduced when a part of the heat sink is formed from resin. Accordingly, in a cooling unit formed from plural heat sinks piled, provided may be fixing plates on the outer sides of the heat sinks on the both ends to hold the cooling unit between the fixing plates for the purpose of fixing the cooling unit, for example.

In each of the above-mentioned embodiments, a shape of a cross section of each component, a shape of a channel, a relative size and such are just exemplifications and not limited to the description.

The invention claimed is:

1. A cooling unit for cooling a heating element that generates heat, the cooling unit comprising:
   a plurality of heat sinks, each of the heat sinks comprising:
      a heat transfer vessel having a heating element mounting surface for mounting of the heating element and at least one internal channel including a going channel and a returning channel for fluid flow of a cooling fluid;
      a header for distribution connected for fluid flow to a cooling fluid inlet of the heat sink and to the going channel of the internal channel; and
      a header for confluence connected for fluid flow to a cooling fluid outlet of the heat sink and to the returning channel of the internal channel, wherein
         the going channel and the returning channel lie on a common plane located within the heat transfer vessel,
         the header for distribution and the header for confluence extend parallel to each other and are located on a first side of the common plane, side-by-side each other, and in direct contact with each other, with one of the header for distribution and the header for confluence being disposed in contact with an end of the heat transfer vessel, so that the one of the header for distribution and the header for confluence that is in contact with the end of the heat transfer vessel is sandwiched by the end of the heat transfer vessel and the other of the header for distribution and the header for confluence, one of the header for distribution and the header for confluence, as a first header, is positioned nearer to the internal channel than is the other of the header for distribution and the header for confluence, the other of the header for distribution and the header for confluence being a second header, the first header is connected for fluid flow to the internal channel through a first connecting channel, the second header is connected for fluid flow to the internal channel through a second connecting channel, the second connecting channel extends from the second header to the internal channel, adjacent the first header, without being connected for fluid flow to the first header, and the internal channel is located on the first side of the common plane;

a single cooling fluid inlet and a single cooling fluid outlet;

a first connecting opening connecting the headers for distribution of the plurality of heat sinks for fluid flow; and a second connecting opening connecting the headers for confluence of the plurality of heat sinks for fluid flow, wherein the single cooling fluid inlet is disposed on only one of the headers for distribution of the headers for distribution of the plurality of heat sinks, the single cooling fluid outlet is disposed on only one of the headers for confluence of the headers for confluence of the plurality of heat sinks, and the internal channels within the respective heat transfer vessels of the plurality of heat sinks are in fluid communication with each other.

2. The cooling unit according to claim 1, wherein the same heat sink, of the plurality of heat sinks, includes the header for distribution on which the single cooling fluid inlet is disposed and the header for confluence on which the single cooling fluid outlet is disposed.

3. The cooling unit according to claim 1, wherein the header for distribution on which the single cooling fluid inlet is disposed is a different heat sink, of the plurality of heat sinks, from the heat sink that includes the header for confluence on which the single cooling fluid outlet is disposed.

* * * * *